United States Patent
Mei et al.

(10) Patent No.: US 12,088,898 B2
(45) Date of Patent: Sep. 10, 2024

(54) MOLDING ASSEMBLY, CAMERA MODULE, MOLDING ASSEMBLY JOINTED BOARD AND MANUFACTURING METHOD

(71) Applicant: Ningbo Sunny Opotech Co., Ltd., Zhejiang (CN)

(72) Inventors: Zhewen Mei, Zhejiang (CN); Qimin Mei, Zhejiang (CN); Bojie Zhao, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 814 days.

(21) Appl. No.: 17/262,359

(22) PCT Filed: Jun. 28, 2019

(86) PCT No.: PCT/CN2019/093886
§ 371 (c)(1),
(2) Date: Jan. 22, 2021

(87) PCT Pub. No.: WO2020/019941
PCT Pub. Date: Jan. 30, 2020

(65) Prior Publication Data
US 2021/0289112 A1 Sep. 16, 2021

(30) Foreign Application Priority Data

Jul. 26, 2018 (CN) .......................... 201810834100.2
Jul. 26, 2018 (CN) .......................... 201821197581.2

(51) Int. Cl.
*H04N 23/55* (2023.01)
*G02B 7/02* (2021.01)
(Continued)

(52) U.S. Cl.
CPC ............. *H04N 23/55* (2023.01); *G02B 7/022* (2013.01); *H04N 23/54* (2023.01); *H05K 5/0034* (2013.01); *G03B 2205/0053* (2013.01)

(58) Field of Classification Search
None
See application file for complete search history.

(56) References Cited

U.S. PATENT DOCUMENTS 6,813,103 B2 * 11/2004 Tansho ............. H01L 31/02325
257/E31.127
2009/0305451 A1 12/2009 Hsuan et al.
(Continued)

FOREIGN PATENT DOCUMENTS

CN 103179788 6/2013
CN 104836941 8/2015
(Continued)

OTHER PUBLICATIONS

Extended European Search Report issued Nov. 5, 2021 in corresponding European Patent Application No. 19840033.5.
(Continued)

*Primary Examiner* — James Wu
*Assistant Examiner* — Christopher L Augustin
(74) *Attorney, Agent, or Firm* — Wenderoth, Lind & Ponack, L.L.P.

(57) ABSTRACT

A molded assembly, a camera module, a jointed board of molded assembly, and a manufacturing method are provided. The molded assembly includes a circuit board and a molded portion, wherein the circuit board has a molding region, a mounting region and at least two pad regions, the molding region surrounds the mounting region, the pad regions are arranged at corners of the circuit board and located outside corresponding corners of the molding region so as to electrically connect to an actuator, and the pad
(Continued)

region has an avoidance boundary, and an angle formed by the avoidance boundary is greater than 90 degrees; wherein the molded portion embeds the molding region, surrounds the mounting region, and has a light window, and the molded portion avoids the pad regions along the avoidance boundary so as to reduce defective rate during production.

20 Claims, 14 Drawing Sheets

(51) Int. Cl.
*H04N 23/54* (2023.01)
*H05K 5/00* (2006.01)

(56) References Cited

U.S. PATENT DOCUMENTS

| | | | | |
|---|---|---|---|---|
| 2011/0194023 A1* | 8/2011 | Tam | ............... | H04N 23/54 348/374 |
| 2013/0161800 A1 | 6/2013 | Byun et al. | | |
| 2015/0222793 A1* | 8/2015 | Kang | ............... | H04N 23/55 348/373 |
| 2015/0348927 A1* | 12/2015 | Kuo | ............... | H01L 21/561 257/737 |
| 2016/0150133 A1* | 5/2016 | Suzuki | ............... | H04N 23/51 348/376 |
| 2016/0191767 A1* | 6/2016 | Otani | ............... | H04N 23/54 29/832 |
| 2017/0310860 A1 | 10/2017 | Wang et al. | | |
| 2018/0035022 A1 | 2/2018 | Wang et al. | | |
| 2018/0035028 A1 | 2/2018 | Wang et al. | | |

FOREIGN PATENT DOCUMENTS

| | | | | |
|---|---|---|---|---|
| CN | 104954637 | | 9/2015 | |
| CN | 205961279 U | * | 2/2017 | ............ B29C 33/44 |
| CN | 304191909 | | 6/2017 | |
| CN | 206629168 | | 11/2017 | |
| CN | 108270948 | | 7/2018 | |
| CN | 208798053 | | 4/2019 | |
| WO | 2018/023887 | | 2/2018 | |

OTHER PUBLICATIONS

Office Action issued Dec. 9, 2021 in corresponding Chinese Application No. 201980038827.2, with English translation.
International Search Report issued Aug. 29, 2019 in International (PCT) Application No. PCT/CN2019/093886.

* cited by examiner

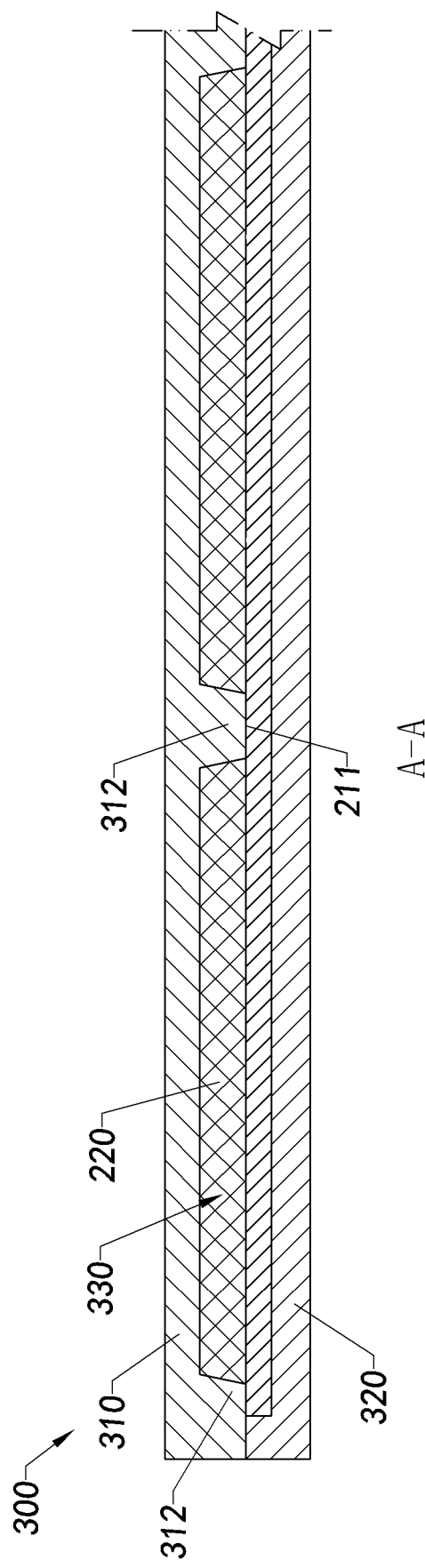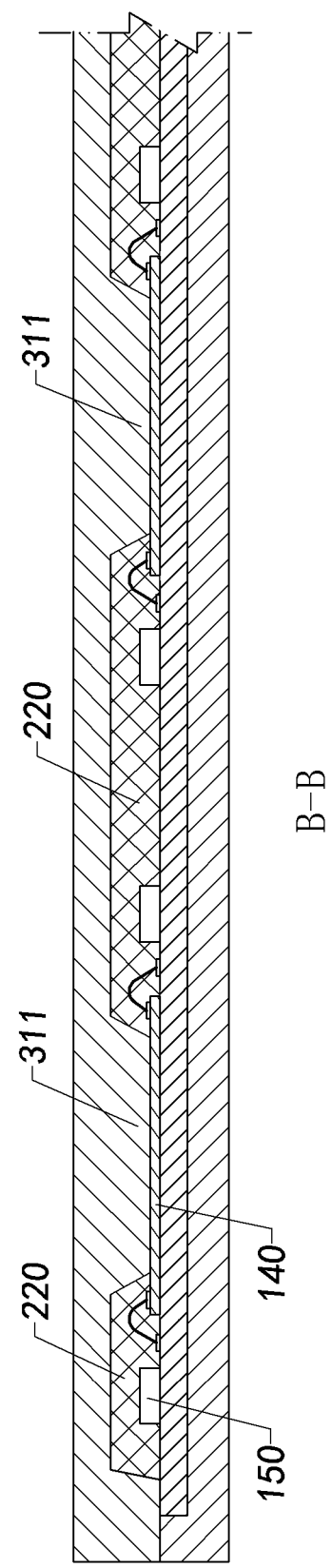
Fig.6 A-A
Fig.7 B-B

MOLDING ASSEMBLY, CAMERA MODULE, MOLDING ASSEMBLY JOINTED BOARD AND MANUFACTURING METHOD

TECHNICAL FIELD

The invention relates to field of molding, and more particularly to a molded assembly, a camera module, a jointed board of molded assembly, and a manufacturing method, which are suitable for an auto focus camera module to reduce defective rate.

BACKGROUND ART

Currently, with the development of the camera module industry, the common camera modules on the market are divided into FF (fixed focus) camera modules and AF (auto focus) camera modules. Conventional auto focus camera modules generally use an actuator such as a motor to achieve zooming, and an electrical connection between the actuator and a circuit board is also needed. Therefore, the circuit board of the conventional auto focus camera module will specially reserve a pad region for electrical connection to the actuator such as the motor.

As the camera module industry is increasingly developing towards miniaturization, manufacturers will minimize the size of the camera module by a molding process such as MOC process or MOB process. That is, capacitors located at an edge of the circuit board and even an edge portion of a photosensitive chip are embedded by a molded lens holder, thereby achieving a purpose of increasing strength of the circuit board and reducing the size of the circuit board. When the molding process is applied to the auto focus camera module, the molding region needs to avoid the pad regions so as to prevent molding material from covering the pad regions and ensure that the motor may be electrically connected to the circuit board.

The ensuing problem is that, as shown in FIG. 1, the reserved pad region 11A in the prior art is arranged to be square, that is, the corners of the molding region 12A are provided with a concave apex angles 121A that are concave at right angles so as to fit and form the pad regions 11A. Correspondingly, the molding fluid needs to continuously turn at right angles at the concave apex angles 121A, resulting in some uncontrollable situations such as backflow and uneven flow rate of the molding fluid.

In addition, a boundary of the square pad region 11A may block the molding fluid. Molding channels formed between the adjacent pad regions 11A may suffer from incomplete injection molding due to the blocking of the pad regions 11A. For the MOC process, the molding material embeds electronic components such as capacitors and gold wires located at the edge of the circuit board, the uneven speed of the molding fluid will impact the gold wires and capacitors, resulting in undesirable situations such as poor contact of electronic components.

CONTENTS OF THE INVENTION

An object of the invention is to provide a molded assembly, a camera module, a jointed board of molded assembly, and a manufacturing method, wherein compared with the design of the square pad region in the prior art, a molding side of a pad region has an avoidance boundary, thereby reducing obstruction to flow of molding fluid.

Another object of the invention is to provide a molded assembly, a camera module, a jointed board of molded assembly, and a manufacturing method, wherein compared with the design of the square pad region in the prior art, the avoidance boundary reduces the possibility of uneven flow rate.

Another object of the invention is to provide a molded assembly, a camera module, a jointed board of molded assembly, and a manufacturing method, wherein compared with the design of the square pad region in the prior art, a variation range of the flow rate of the molding fluid is reduced, thereby reducing impact on electronic components such as capacitors and gold wires embedded by the molding fluid and avoiding undesirable situations such as poor contact of the electronic components.

Another object of the invention is to provide a molded assembly, a camera module, a jointed board of molded assembly, and a manufacturing method, wherein compared with the design of the square pad region in the prior art, the avoidance boundary makes the molding fluid flow in sufficiently, thereby reducing the possibility of undesirable phenomena such as incomplete injection molding and reducing defective rate.

Another object of the invention is to provide a molded assembly, a camera module, a jointed board of molded assembly, and a manufacturing method, wherein a side flow channel of the pad region and an inlet and a outlet of the flow channel is connected by a buffer flow channel which provides buffer space for flowing of the molding fluid, so that the molding fluid may adapt to changes in the flow channel, making it easier to control the flow rate.

Another object of the invention is to provide a molded assembly, a camera module, a jointed board of molded assembly, and a manufacturing method, wherein the buffer flow channel prevents the molding fluid from continuously turning at right angles, thereby avoiding some situations such as backflow and uneven flow rate of the molding fluid.

Another object of the invention is to provide a molded assembly, a camera module, a jointed board of molded assembly, and a manufacturing method, wherein the molding fluid flows from the buffer flow channel into the side flow channel of the pad region, so that the possibility of splashing the molding fluid is reduced, thereby avoiding the undesirable phenomena such as incomplete injection molding, as compared with the existing situation in the prior art that the molding fluid continuously turns at right angles for avoidance.

Another object of the invention is to provide a molded assembly, a camera module, a jointed board of molded assembly, and a manufacturing method, wherein an angle formed by the pad region at the molding side is greater than 90° for the convenience of formation of the avoidance boundary and the buffer flow channel.

Another object of the invention is to provide a molded assembly, a camera module, a jointed board of molded assembly, and a manufacturing method, wherein two pad regions may be arranged on a same side of the molded assembly, or they may be oppositely arranged on the circuit board, thereby adapting to electrically connecting to different actuators.

Another object of the invention is to provide a molded assembly, a camera module, a jointed board of molded assembly, and a manufacturing method, wherein when the two pad regions may be arranged on the same side of the molded assembly, it is convenient for production of the jointed board of molded assembly.

Another object of the invention is to provide a molded assembly, a camera module, a jointed board of molded assembly, and a manufacturing method, wherein when the two pad regions may be arranged on the same side of the molded assembly, they may be arranged at a side for mounting a connector, or at a side opposite to the side for mounting the connector, or at any side adjacent to the side for mounting the connector without limitation, according to the requirement or the different actuators for use.

Another object of the invention is to provide a molded assembly, a camera module, a jointed board of molded assembly, and a manufacturing method, wherein the manufacturing method is applied to an AF (auto focus) camera module to reduce the defective rate in the molding process.

In order to achieve at least one of the above objectives, according to one aspect of the invention, the invention further provides a molded assembly, which includes:
 a circuit board, wherein the circuit board has a molding region, a mounting region and at least two pad regions, the molding region surrounds the mounting region, and the pad regions are arranged at corners of the circuit board and located outside the corresponding corners of the molding region so as to electrically connect to an actuator, and the pad region has an avoidance boundary, and an angle formed by the avoidance boundary is greater than 90°; and
 a molded portion, wherein the molded portion embeds the molding region, surrounds the mounting region, and has a light window, and the molded portion avoids the pad regions along the avoidance boundary.

According to an embodiment of the invention, the angle formed by the avoidance boundary of the pad region is 180°.

According to an embodiment of the invention, the angle formed by the avoidance boundary of the pad region is an obtuse angle.

According to an embodiment of the invention, the size of the narrowest part of the molded portion is at least 0.15 mm.

According to an embodiment of the invention, the adjacent pad regions are symmetrically provided.

According to an embodiment of the invention, at least two pad regions are arranged on a mounting side of the circuit board, and wherein the mounting side is provided for mounting a connector.

According to an embodiment of the invention, at least two pad regions are arranged on a side opposite to the mounting side of the circuit board, and wherein the mounting side is provided for mounting the connector.

According to an embodiment of the invention, at least two pad regions are arranged on a side adjacent to the mounting side of the circuit board, and wherein the mounting side is provided for mounting the connector.

According to an embodiment of the invention, the molded assembly further includes a photosensitive element, wherein the photosensitive element is mounted in the mounting region and is surrounded by the molded portion in a closed manner, and wherein the light window corresponds to a photosensitive element so as to form a photosensitive path.

According to an embodiment of the invention, the molded portion is molded at an edge portion of the photosensitive element.

According to an embodiment of the invention, the molded assembly further includes at least one electronic component, wherein the electronic component is operatively mounted in the molding region, and wherein the molded portion embeds the electronic component.

According to another aspect of the invention, the invention also provides a camera module, which includes:
 any of the above molded assemblies;
 a lens assembly; and
 an actuator, wherein the actuator supports the lens assembly on the molded assembly in a drivable manner so that the lens assembly corresponds to the light window of the molded assembly, and wherein the actuator is operatively connected to the pad region of the circuit board.

According to another aspect of the invention, the invention also provides a jointed board of molded assembly for forming a plurality of molding assemblies with pad regions by cutting, which includes:
 a jointed board of circuit board, wherein the jointed board of circuit board has a plurality of molding regions, a plurality of mounting regions and a plurality of main pad regions, wherein the molding regions are arranged in an array on the jointed board of circuit board, the adjacent molding regions are neighboring, the molding regions surround the mounting regions correspondingly, the main pad regions are cut and separated to form pad regions at the corners of the molded assembly, and wherein the pad region formed after cutting has an avoidance boundary, and an angle formed by the avoidance boundary is greater than 90°; and
 a one-piece molded portion, wherein the one-piece molded portion embeds the molding regions, surrounds the mounting regions, and defines a plurality of light windows.

According to an embodiment of the invention, the main pad regions are arranged at intervals on a length side of the jointed board of circuit board, so that the pad regions formed after cutting are located at the corners of the mounting side of the resulting molded assembly.

According to an embodiment of the invention, the main pad regions are arranged at the corners of a connecting side of the adjacent molding regions in a same column, so that the pad regions formed after cutting are located at the corners of a side opposite to the mounting side of the resulting molded assembly.

According to an embodiment of the invention, the main pad regions are arranged at the corners of a side adjacent to the molding regions of the adjacent two columns in a same group, so that the pad regions formed after cutting are located at the corners of a side adjacent to the mounting side of the resulting molded assembly.

According to an embodiment of the invention, the main pad regions are arranged at the corners of the side of a same column of the molding region in each column, so that the pad regions formed after cutting are located at the corners of a side adjacent to the mounting side of the resulting molded assembly.

According to an embodiment of the invention, the main pad regions are arranged at the corners of a side adjacent to the mounting side of the molding region in a same row, so that the pad regions formed after cutting and separating the main pad regions are located at a side adjacent to the mounting side of the molded assembly.

According to an embodiment of the invention, the angle formed by the avoidance boundary of the pad regions formed after cutting is 180°.

According to an embodiment of the invention, the angle formed by the avoidance boundary of the pad regions formed after cutting is an obtuse angle.

According to an embodiment of the invention, the jointed board of molded assembly further includes a plurality of photosensitive elements, wherein the photosensitive elements are mounted in the corresponding mounting regions and are closely surrounded by the one-piece molded portion, and wherein the light window corresponds to the photosensitive element so as to form a photosensitive path.

According to an embodiment of the invention, the one-piece molded portion embeds an edge portion of the photosensitive element.

According to an embodiment of the invention, the jointed board of molded assembly further includes a plurality of electronic components, wherein the electronic components are operatively arranged in the corresponding molding regions and embedded by the one-piece molded portion.

According to another aspect of the invention, the invention further provides a method for manufacturing a molded assembly, which includes:
(1) fixing a circuit board to a lower mold, wherein the circuit board has a molding region, a mounting region, and at least two pad regions, wherein the molding region surrounds the mounting region, and the pad regions are arranged at corners of the circuit board and located at outside of the corresponding corners of the molding region, and wherein the pad region has an avoidance boundary, and an angle formed by the avoidance boundary is greater than 90°;
(2) clamping an upper mold with the lower mold, wherein the upper mold is pressed against the pad regions and the mounting region, and a molding space is formed between the upper mold and the molding region of the circuit board, wherein the molding space has a buffer flow channel formed along the avoidance boundary;
(3) injecting molding material into the molding space;
(4) curing the molding material to form a one-piece molded portion embedding the molding region; and
(5) removing the upper mold and the lower mold to form the molded assembly.

BRIEF DESCRIPTION OF THE DRAWINGS

FIG. 6 is a cross sectional view along a A-A direction during a molding process of the jointed board of molded assembly according to the above preferred embodiment of the invention.

FIG. 7 is a cross sectional view along a B-B direction during the molding process of the jointed board of molded assembly according to the above preferred embodiment of the invention.

SPECIFIC EMBODIMENTS

Figure 1:
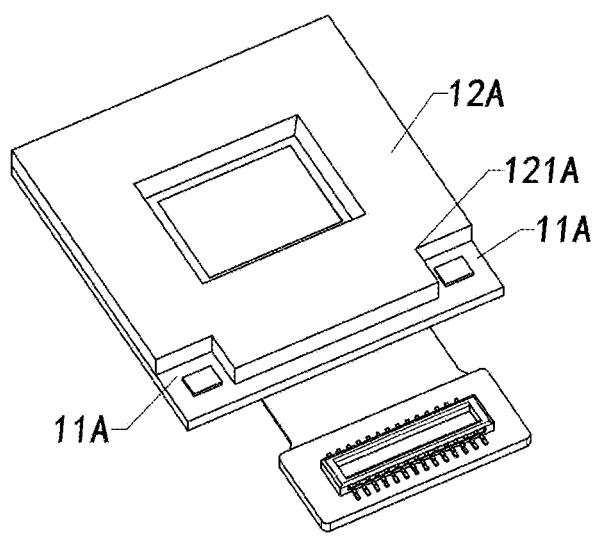
FIG. 1 is a perspective view of a molded assembly in the prior art.

The following description is used to disclose the invention so that those skilled in the art may implement the invention. The preferred embodiments in the following description are only examples, and those skilled in the art may think of other obvious variations. The basic principles of the invention defined in the following description may be applied to other embodiments, modifications, improvements, equivalents, and other technical solutions that do not depart from the spirit and scope of the invention.

Those skilled in the art should understand that, in the disclosure of the invention, the orientation or positional relationship indicated by the terms such as "longitudinal", "lateral", "upper", "lower", "front", "rear", "left", "right", "vertical", "horizontal", "top", "bottom", "inner", "outer", are based on the orientation or positional relationship shown in the drawings, which is only for the convenience of describing the invention and simplifying the description, rather than indicating or implying that the referred device or element must have a specific orientation, be constructed and operated in a specific orientation, therefore the above terms should not be understood as limiting the invention.

It can be understood that, the term "a/an" should be understood as "at least one" or "one or more", i.e., in one embodiment, the number of an element may be one, while in other embodiment, the number may be more than one, therefore the term "a/an" cannot be understood as a restriction on the number.

In the description of this specification, descriptions with reference to the terms such as "one embodiment", "some embodiments", "examples", "specific example(s)", or "some examples", mean the specific features, structures, materials or characteristics described in conjunction with the embodiment or example, are included in at least one embodiment or example of the invention. In this specification, the schematic representations of the above terms do not necessarily refer to the same embodiment or example. Moreover, the described specific features, structures, materials or characteristics may be combined in any one or more embodiments or examples in a suitable manner. In addition, those skilled in the art may integrate and combine the different embodiments or examples and the features of the different embodiments or examples described in this specification without mutual contradiction.

As shown in FIGS. 2-24, the invention provides a molded assembly, a camera module and a jointed board of molded assembly. In order to solve the defects in the prior art, a pad region is redesigned to reduce defective rate in production of an AF (auto focus) camera module.

Figure 2:
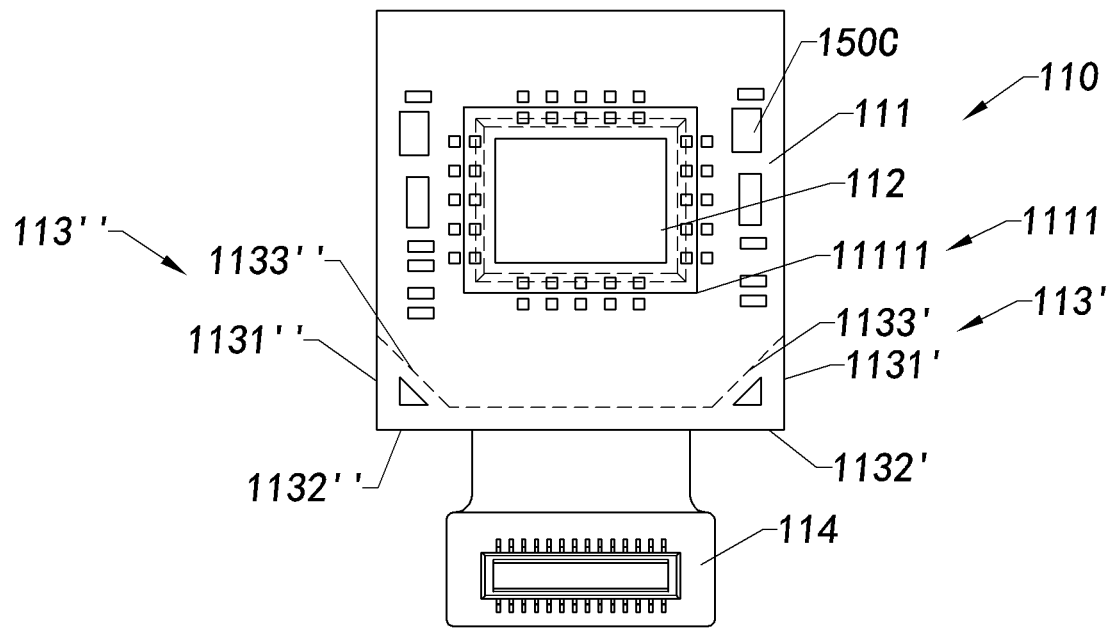
FIG. 2 is a top view of a circuit board of a molded assembly according to a preferred embodiment of the invention.
Figure 3:
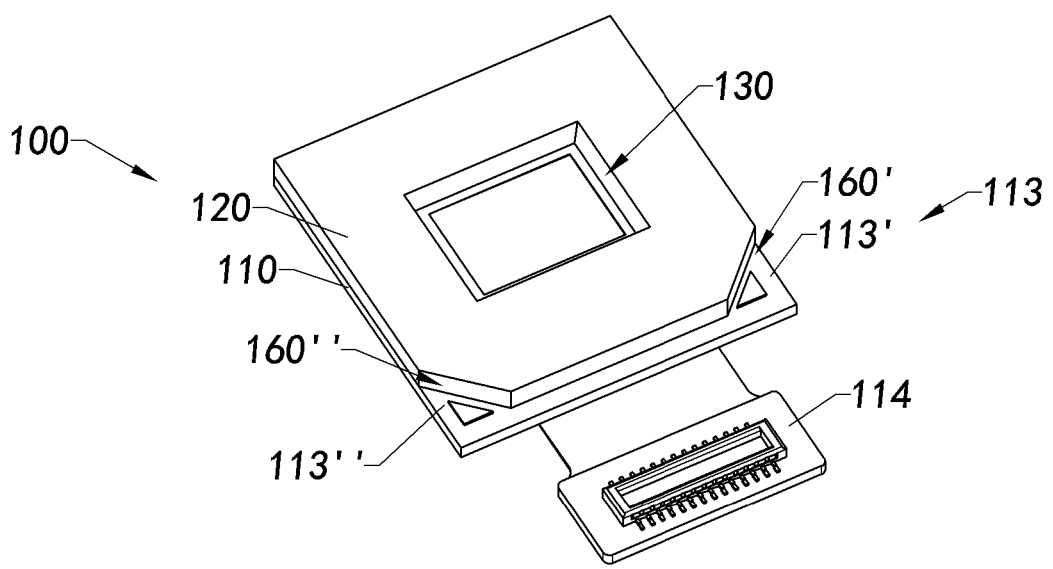
FIG. 3 is a perspective view of the molded assembly according to the above preferred embodiment of the invention.

FIGS. 2 and 3 show a molded assembly 100 of a preferred embodiment of the invention. The molded assembly 100 includes a circuit board 110 and a molded portion 120, wherein the molded portion 120 is integrally molded on the circuit board 110 to define a light window 130 so as to form a photosensitive path.

Particularly, the circuit board 110 has a molding region 111, a mounting region 112, and at least two pad regions 113, wherein the molding region 111 surrounds the mounting region 112 in a closed manner, and the pad regions 113 are arranged at corners of the circuit board 110 and are located outside the corresponding corners of the molding region 111, wherein the at least two pad regions 113 are respectively used to electrically connect to positive and negative electrodes of an actuator.

The present invention is illustrated by taking the two pad regions 113 as an example, which is not a limitation. Those skilled in the art may know that, more than two pad regions 113 may be used and designed as required. As an example, for convenience of description and distinction, the two pad regions 113 are respectively referred to as a first pad region 113' and a second pad region 113", wherein the characteristics of the first pad region 113' and the second pad region 113' may be applied to each other, and this will not be repeated in the invention.

Figure 23:
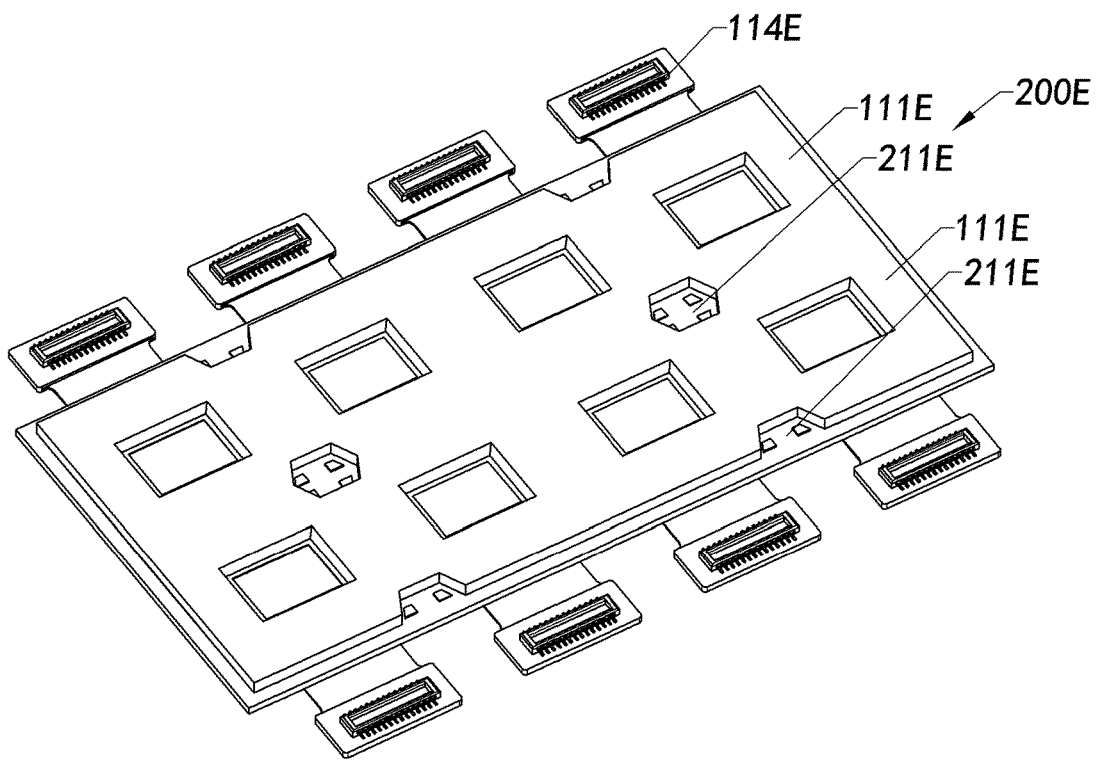
FIG. 23 is a perspective view of another jointed board of molded assembly according to another variant embodiment of the above second preferred embodiment of the invention, and the jointed board of molded assembly is suitable for the production of the molded assemblies according to the above another modified embodiment.
Figure 24:
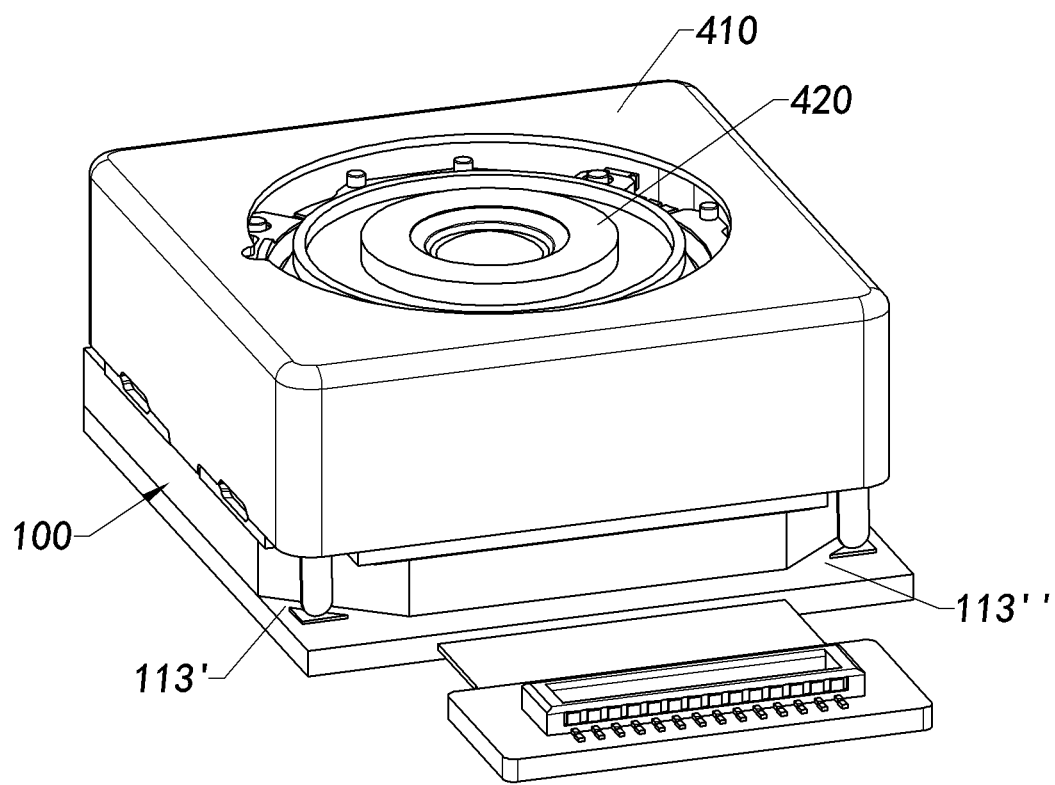
FIG. 24 is a perspective view of an auto focus camera module According to an embodiment of the invention.

During a molding process, the molding region 111 is covered by a molding fluid, and the molded portion 120 is formed after curing. In other words, the molded portion 120 embeds the molding region 111, and surrounds the mounting region 112 in a closed manner. The mounting region 112 is not covered by the molding fluid, and provides space for mounting a photosensitive element 140 and/or at least one electronic component 150. For different molding processes, as shown in FIGS. 23 and 24, the components mounted in the mounting region 112 may be different. For example, for a MOC process, the photosensitive element 140 is electrically connected and attached to the mounting region 112, while an edge region is located in the molding region 111, so that after curing the molded portion 120 is molded on the edge region of the photosensitive element 140. For example, for a MOB process, the photosensitive element 140 is electrically connected and attached to the mounting region 112, while the electronic component 150 is mounted in the molding region 111, so that after curing the molded portion 120 embeds the electronic component 150.

The first pad region 113' and the second pad region 113" are mirror-symmetrical and not covered by the molding fluid, to form a first welding space 160' and a second pad region 160" for electrically connecting to the actuator such as a motor, thereby assembling and manufacturing the auto focus camera module. In other words, during the molding process, the molding fluid flows and avoids the first pad region 113', the second pad region 113" and the mounting region 112 to form the mold portion 120. The first welding space 160' and the second pad space 160" respectively corresponding to the first pad region 113' and the second pad region 113" are formed at the outside corners of the molded portion 120.

In a preferred embodiment of the invention, the first pad region 113' and the second pad region 113" are implemented as triangles, and correspondingly, the first welding space 160' and the second pad space 160" extends upward from the circuit board 110, as shown in FIGS. 2 and 3.

The triangular first pad region 113' has two first outer sides 1131', 1132' and a first avoidance boundary 1133', wherein the first outer sides 1131', 1132' and the first avoidance boundary 1133' is connected end-to-end to form the first pad region 113'. Since the first pad region 113' is arranged at a corner of the circuit board 110, the two first outer sides 1131' and 1132' are implemented as adjacent sides of an apex angle of the circuit board 110. The first avoidance boundary 1133' and the boundary of the molding region 111 coincide, that is, the first pad region 113' forms the first avoidance boundary 1133' at the molding side (the side in contact with the molding region 111), and the first avoidance boundary 1133' separates and defines the first pad region 113' and the molding region 111.

Correspondingly, the triangular second pad region 113" is composed of two second outer sides 1131", 1132" and a second avoidance boundary 1133" connecting end-to-end, wherein the two second outer sides are implemented as adjacent sides of an apex angle of the circuit board 110, wherein the second avoidance boundary 1133" is also a part of the boundary of the molding region 111, and is used to separate and define the second pad region 113" and the molding region 111. The second avoidance boundary 1133" is also located at the molding side of the second pad region 113", and is in contact with the molding region 111.

An angle formed by the first avoidance boundary 1133' and the second avoidance boundary 1133" is greater than 90°. In this preferred embodiment, the angle formed by the first avoidance boundary 1133' and the second avoidance boundary 1133" is 180°, i.e., it is implemented as a straight line, so as to be formed obliquely at the corresponding corner of the circuit board 110.

During the molding process, the molding fluid needs to avoid the first pad region 113' along the oblique avoidance boundary 1133' and flow in the area defined by the molding region 111. Compared with the right-angle design of a square, the oblique first avoidance boundary 1133' and the second avoidance boundary 1133" have less resistance to the molding fluid, and the molding fluid may flow in sufficiently due to the reduced obstruction to its flow. At the same time, the increase in the flow rate of the molding fluid is reduced, and the problem of uneven flow rate is alleviated. In particular, for the MOC or MOB process, the molding fluid needs to pass through the electronic components 150, and a variation range of the flow rate of the molding fluid is reduced, thereby relieving the impact on the embedded components 150 such as capacitors, gold wires, and avoiding undesirable situations such as poor contact of the electronic components 150.

Compared with the right-angle design of a square, corresponding flow channels formed during the molding process do not have a continuous right-angled sudden change in size, and they form an oblique first buffer flow channel and second buffer flow channel respectively corresponding to the first avoidance boundary 1133' and the second avoidance boundary 1133". The molding fluid flows along the oblique first buffer channel and second buffer channel, which may adapt to changes in the size of the flow channel, without continuous right-angle turning, and the possibility of splashing, backflow, or uneven flow rate of the molding fluid is reduced.

In addition, compared to the square design in the prior art, under a condition of same area, a minimum distance between the first avoidance boundary 1133' or the second avoidance boundary 1133" and an inner edge 1111 of the molding region 111 is larger. The specific explanation conforms to basic common sense of mathematics. Under the condition of the same area, the boundary edge of a square pad region forms a right-angle protrusion, and in a preferred embodiment of the invention, a triangular first pad region 113' disperses the protruding right-angle area of the square pad region, therefore a perpendicular distance between an apex angle point of the first inner edge and the first avoidance boundary 1133' is larger.

As shown in FIG. 3, in a preferred embodiment of the invention, the triangular first pad region 113' and second pad region 113" are formed at a mounting side of the connector 114, and respectively arranged at the two corners of the mounting side of the connector 114.

At this time, the first pad region 113' and the second pad region 113" are located at the same side. During the molding process, a side flow channel in the pad region is formed between the first pad region 113' and the second pad region 113". When flowing into and out of the side flow channel of the pad region, the molding fluid needs to avoid the first pad region 113' and the second pad region 113" at both sides. However, due to the existence of the first avoidance boundary 1133' and the second avoidance boundary 1133", the restriction to the molding fluid entering or exiting the side flow channel of the pad region is reduced as compared with the prior art, thereby avoiding poor injection of the molded portion 120 formed in the side flow channel of the pad region.

That is to say, the design of the invention adapts to the miniaturization trend of the camera module without affecting the molding process and the formation of the molded portion. In the prior art, miniaturization is achieved by reducing the size of the flow channel or the narrowest part of the molded portion, but this will affect the molding fluid to flow into and out of the side flow channel of the pad region, thereby affecting the formation of the molded portion. In the invention, by redesigning the pad regions, the miniaturization trend of the camera module is achieved without affecting the molding process and the formation of the molded portion.

In actual production, in order to achieve the miniaturization of the camera module, the size of the side flow channel of the pad region or the molded portion is at least 0.1 mm, and this affects the flow of the molding materials. According to the design of the invention, the narrowest size of the molded portion may be 0.15 mm, even if the narrowest part of the molded portion increases its size, it will not affect the overall miniaturization.

Figure 4:
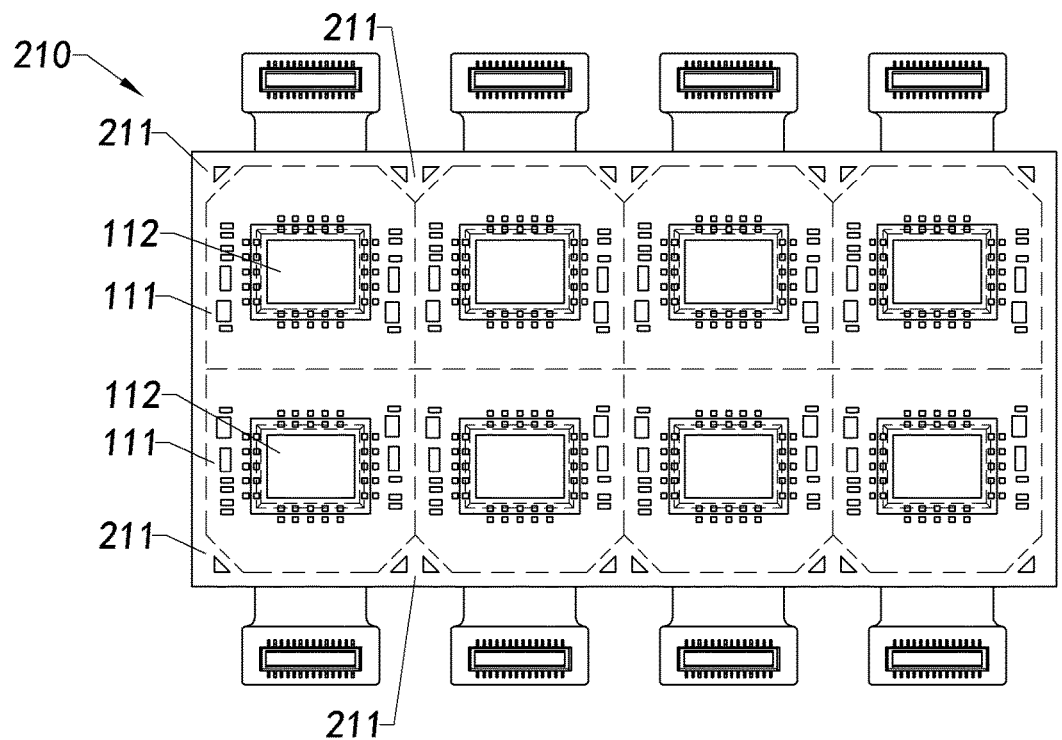
FIG. 4 is a top view of a jointed board of circuit board for a jointed board of molded assembly according to a preferred embodiment of the invention.
Figure 5:
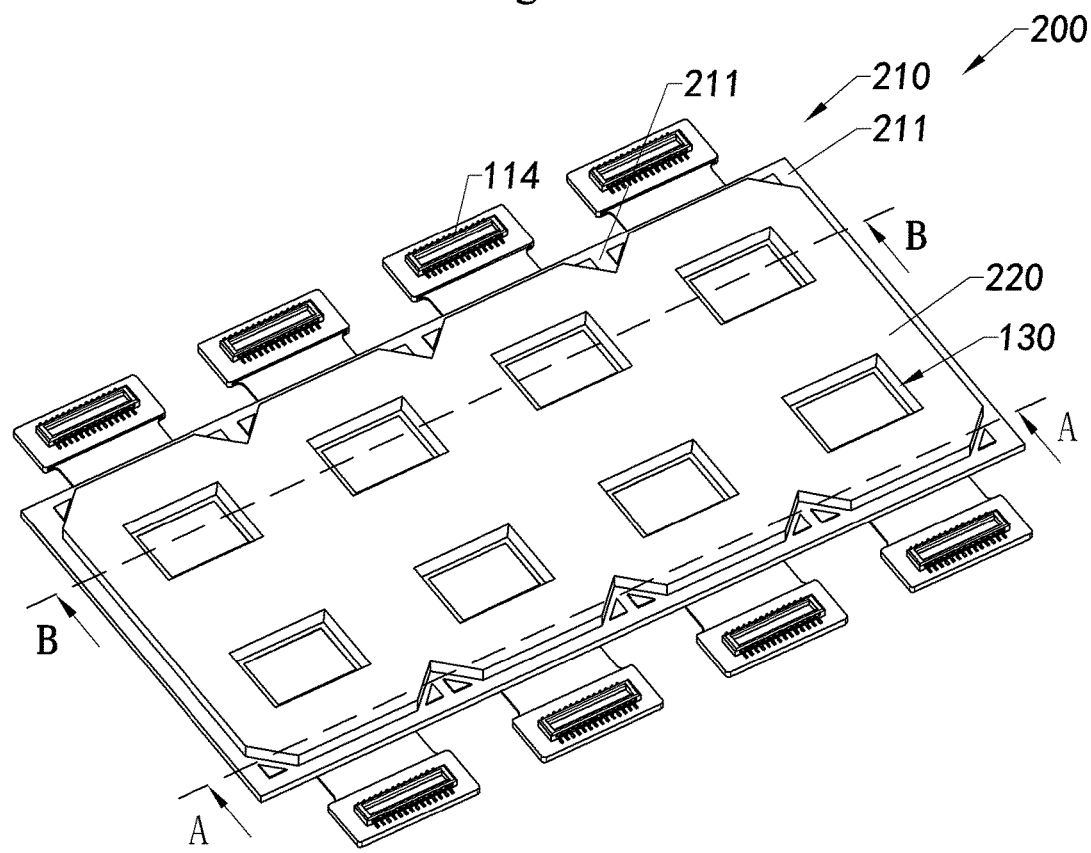
FIG. 5 is a perspective view of the jointed board of molded assembly according to the above preferred embodiment of the invention, and the jointed board of molded assembly is suitable for production of the molded assemblies according to the above preferred embodiment.

As shown in FIGS. 4 and 5, in order to implement the molded assembly 100 of a preferred embodiment of the invention, a jointed board of molded assembly 200 of a preferred embodiment may be manufactured, and then it is cut to form the molded assembly 100. The jointed board of molded assembly 200 includes a jointed board of circuit board 210 and a one-piece molded portion 220, wherein the one-piece molded portion 220 is integrally formed on the jointed board of circuit board 210 through a molding process.

The jointed board of circuit board 210 has a plurality of molding regions 111, a plurality of mounting regions 112, and a plurality of main pad regions 211, wherein the molding regions 111 are arranged in an array on the jointed board of circuit board 210, the adjacent molding regions 111 are neighboring, the molding regions 111 surround the mounting regions 112 correspondingly, and the triangular main pad regions 211 are arranged at two length sides of the jointed board of circuit board 210 corresponding to the molding regions 111.

During the molding process, the molding regions 111 are covered by the molding fluid. Since the adjacent molding regions 111 are neighboring, when the molding fluid covers all the molding regions 111, it solidifies to form the one-piece molded portion 220. In other words, the one-piece molded portion 220 embeds all the molding regions 111. The mounting regions 112 are not covered by the molding fluid, and the formed one-piece molded portion 220 surrounds the mounting regions 112. The photosensitive chips 140 are mounted on the mounting regions 112, and the one-piece molded portion 220 defines the light windows 130 corresponding to the photosensitive chips 140 so as to form photosensitive paths.

The jointed board of circuit board 210 includes a plurality of connectors 114, wherein the connectors 114 are correspondingly arranged at the two opposite sides of the jointed board of circuit board 210, and are electrically connected to corresponding regions. The present invention is described by taking the two opposite mounting sides of the connectors 114 as the length of the jointed board of circuit board 210, and the two opposite sides where no connector 114 is mounted as the width, and this is not a limitation. The direction extending along the length of the jointed board of circuit board 210 is the length direction, and the direction extending along the width of the jointed board of circuit board 210 is the width direction. Correspondingly, the elements are arrayed in a row along the length direction, and arrayed in a column along the width direction. This is just for convenience of explanation, and is not a limitation.

In order to obtain the molded assembly 100 of the above preferred embodiment, the main pad regions 211 are formed at the length side of the jointed board of circuit board 210, and the outer side of the corners of the mounting sides (sides for mounting the connectors 114) of the corresponding molding regions 111, so as to be cut to form the pad regions 113 at the corners of the mounting sides of the molding regions 111. In this preferred embodiment, the main pad regions 211 located at the two width ends of the jointed board of molded assembly 200 are right-angled triangles, and the other main pad regions 211 are isosceles triangles, which are cut and separated in the width direction to form two pad regions 113 of right-angled triangles.

After the molding fluid is injected from a width end of the jointed board of molded assembly 200, the molding fluid flows along the flow channel in length direction and the flow channel in width direction which are defined by the molding regions 111. When the molding fluid avoids along the avoidance boundary (a side in contact with the molding region 111) of the main pad regions 211, since the avoidance boundary is oblique, the resistance to the molding fluid is small. Especially for the flow channel formed between two adjacent main pad regions 211, the molding fluid may be fully filled, thereby reducing the situation of incomplete injection in the molding process of the jointed board and improving the overall yield.

As shown in FIGS. 6 and 7, the mold 300 used to make the jointed board of molded assembly 200 includes an upper mold 310 and a lower mold 320, wherein the upper mold 310 and the lower mold 320 are combined to define a molding space 330, wherein a fluid-like molding material enters the molding space 330, thereby performing the molding process and other steps. The molded portion of the mold 300 is the same as a conventional mold, except that the bottom surface of the mold 310 of the invention is in contact with the main pad regions 211 to prevent the main pad regions 211 from being covered and molded, thereby forming the welding space.

Particularly, the jointed board of circuit board 210 is fixed to the lower mold 320, wherein the upper mold 310 and the lower mold 320 are combined, and the molding space 330 defined by the two corresponds to the molding regions 111, so that the fluid-like molding material cures and at least integrally forms a one-piece molded portion 220 on the jointed board of circuit board 210.

Preferably, a press-fitting edge is reserved at periphery of the jointed board of circuit board 210 for the press-fit of the upper mold 310, so that the molding space 330 is sealed and leakage of the molding material is avoided. After the molding process, the reserved press-fitting edge may be cut and removed, thereby reducing the overall volume. The press-fitting edge at the connection side may not be cut because it is connected to the connector, as shown in the drawings such as FIG. 3 and FIG. 8. That is to say, when the pad regions of the molded assembly are located at the connection side, the pressing edge is arranged between the two pad regions and they are not covered.

The upper mold 310 further includes a plurality of first protrusions 311 corresponding to the mounting regions 112 and a plurality of second protrusions 312 corresponding to the main pad regions 211, wherein the first protrusions 311 and the second protrusions 312 are formed by protruding from the bottom surface of the upper mold 310. The shape and size of the second protrusion 312 correspond to the shape and size of the main pad region 211, so as to cover the main pad region 211 and prevent the molding fluid from covering the main pad region 211. In this preferred embodiment, the cross section of the second protrusion 312 is implemented as a triangle corresponding to the main pad region 211.

The first protrusions 311 cover the mounting regions 112 to prevent the molding material from contaminating the photosensitive elements 140, so as to form a plurality of light windows 130. For example, in the MOC process, the photosensitive elements 140 and the electronic components 150 may be mounted first, then the molding process is performed, and the bottom surface of the first protrusion 311 abuts against the surface of the photosensitive element 140. In the MOB process, the molding process may be performed first, then the photosensitive elements 140 and the electronic components 150 are mounted, and the bottom surface of the first protrusion 311 abuts against the surface of the circuit board corresponding to the mounting region 112, this is only described as an example herein and not a limitation.

Preferably, in order to facilitate the mold drafting, the sizes of the first protrusion 311 and the second protrusion 312 are gradually reduced from top to bottom, thereby reducing the drafting resistance. Correspondingly, the size of the light window 130 is gradually decreased from top to bottom; and the size of the welding space corresponding to the main pad region 211 is gradually decreased from top to bottom.

After curing and drafting, the jointed board of molded assembly 200 is cut along a predetermined cutting line, to form a plurality of the molded assemblies 100 of the above preferred embodiment. Particularly, the jointed board of circuit board 210 is cut to form a plurality of circuit boards 110, the molding regions 111 are separated from each other, and the corresponding one-piece molded portion 220 is cut to form the molded portions 120. At this time, the main pad region 211 is divided to form the pad regions 113, which are located at the corners of the mounting side of the molded assembly 100.

Figure 8:
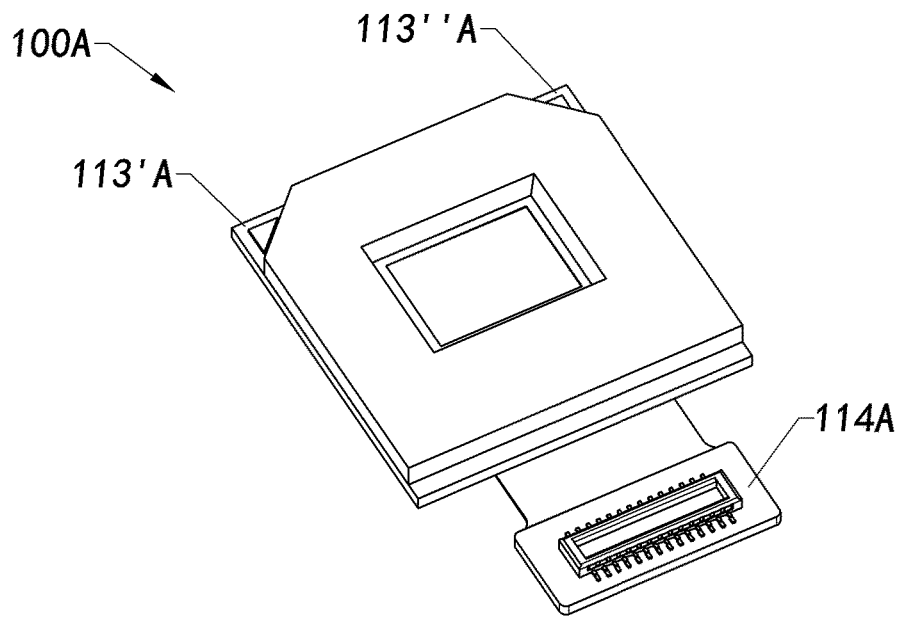
FIG. 8 is a perspective view of a molded assembly according to a first variant embodiment of the above preferred embodiment of the invention.
Figure 9:
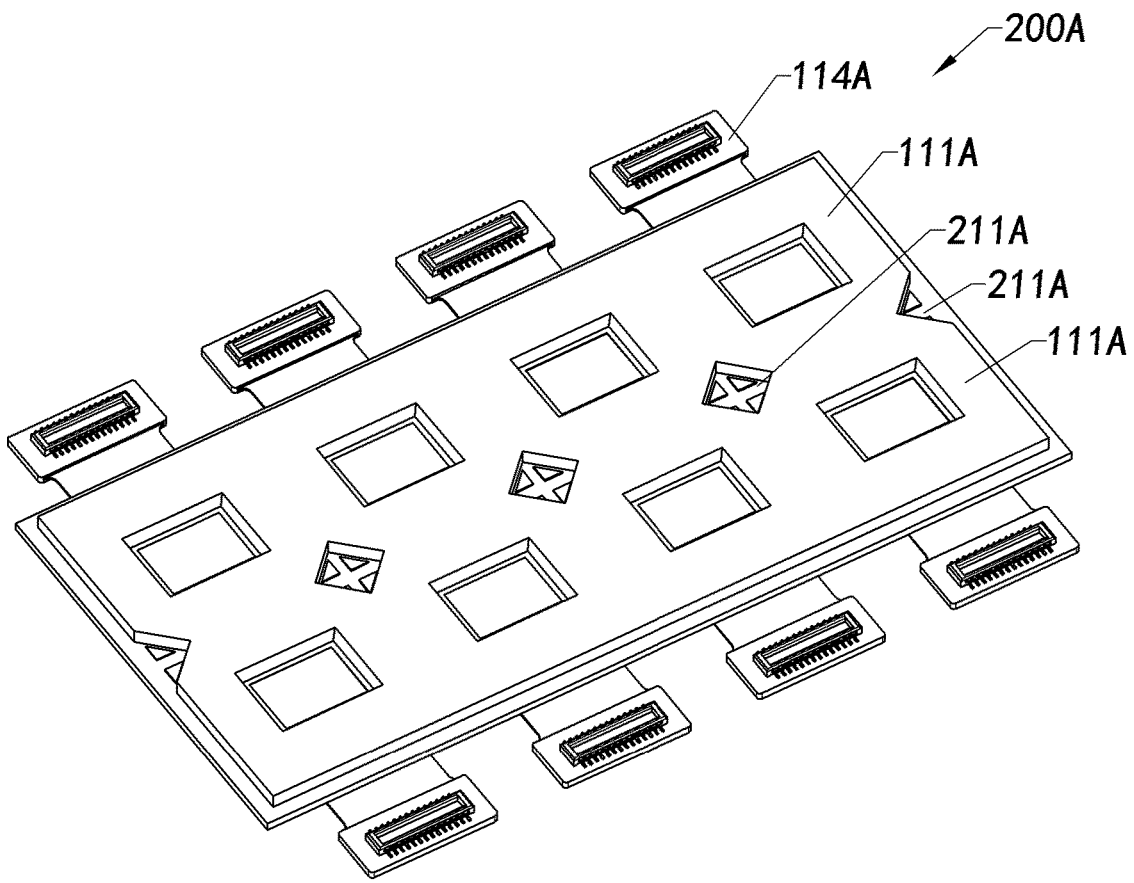
FIG. 9 is a perspective view of a jointed board of molded assembly according to a first variant embodiment of the above preferred embodiment of the invention, and the jointed board of molded assembly is suitable for the production of the molded assemblies according to the above first modified embodiment.
Figure 10:
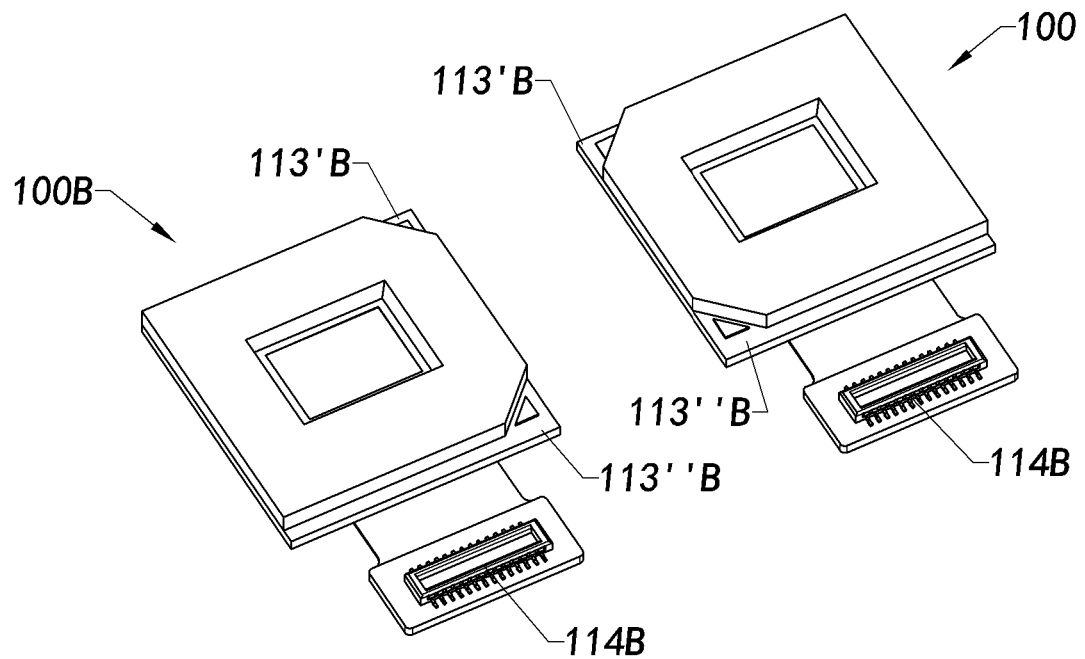
FIG. 10 is a perspective view of a molded assembly according to a second variant embodiment of the above preferred embodiment of the invention.

As shown in FIGS. 8-9, it is a first variant embodiment of this preferred embodiment. The difference from the preferred embodiment is that, in a molded assembly 100A, a triangular first pad region 113'A and second pad region 113"A are arranged at corners of a side opposite to the mounting side, instead of the mounting side where a connectors 114A are mounted.

Correspondingly, as shown in FIG. 9, in order to form a molded assembly 100A after cutting, in a jointed board of molded assembly 200A, a main pad region 211A is arranged at the corners of a connecting side of adjacent molding regions 111A in a same row, so that the first pad region 113'A and the second pad region 113"A formed by separating the main pad region 211A after cutting are arranged at a side opposite to the mounting side of the molded assembly 100A.

Further, in the first variant embodiment of this preferred embodiment, except that a main pad regions 211A located at two width ends of the jointed board of molded assembly 200A are implemented as triangles, and each of them is separated into two parts by cutting in the length direction, the other main pad regions 211A in the middle region are implemented as squares, and each of them is divided into four parts by cutting in the length direction and the width direction, and located at the corners of the corresponding molded assembly 100A.

Correspondingly, in the mold 300, except that the cross section of the first protrusions 311 at the two width ends of the upper mold 310 is a triangle, the cross section of the other first protrusions 311 in the middle region is a square, corresponding to the size and shape of the main pad region 211.

As shown in FIGS. 10-13, it is a second variant embodiment of this preferred embodiment. The difference from the preferred embodiment is that, in a molded assembly 100B, a triangular first pad region 113'B and second pad region 113"B are arranged at a side adjacent to the mounting side, instead of the mounting side where a connectors 114B are mounted.

Figure 11:
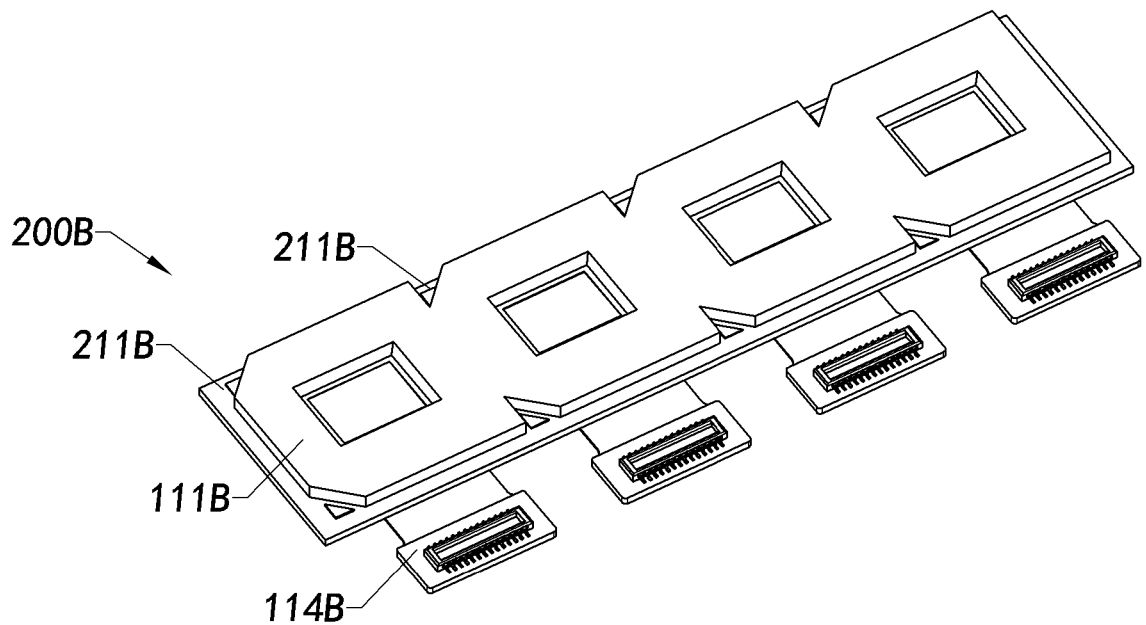
FIG. 11 is a perspective view of a jointed board of molded assembly according to a second variant embodiment of the above preferred embodiment of the invention, and the jointed board of molded assembly is suitable for the production of the molded assemblies according to the above second modified embodiment.

Correspondingly, as shown in FIG. 11, in order to form the molded assembly 100B after cutting, in a jointed board of molded assembly 200B, a main pad regions 211B are arranged at corners of a side adjacent to the mounting side of a molding regions 111B in a same row, so that the first pad region 113'B and the second pad region 113"B formed after cutting and separating the main pad region 211B are arranged at a side adjacent to the mounting side of the molded assembly 100B. At this time, the position arrangements of the pad regions obtained by cutting the molding regions 111B in the same row are consistent, for example, they are all located at the left side adjacent to the mounting side of the molding regions 111B, or all located at the right side adjacent to the mounting side of the molding regions 111B.

Figure 13:
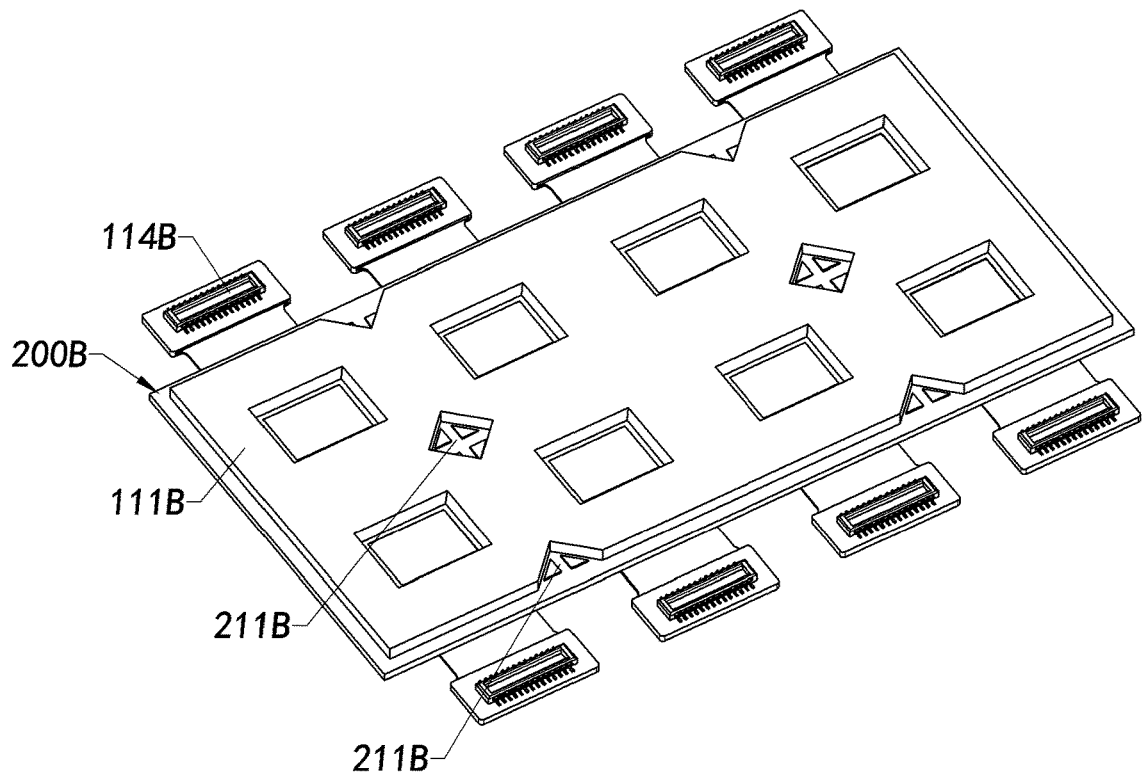
FIG. 13 is a perspective view of another jointed board of molded assembly according to a second variant embodiment of the above preferred embodiment of the invention, and the jointed board of molded assembly is suitable for the production of the molded assemblies according to the above second modified embodiment.
Figure 14:
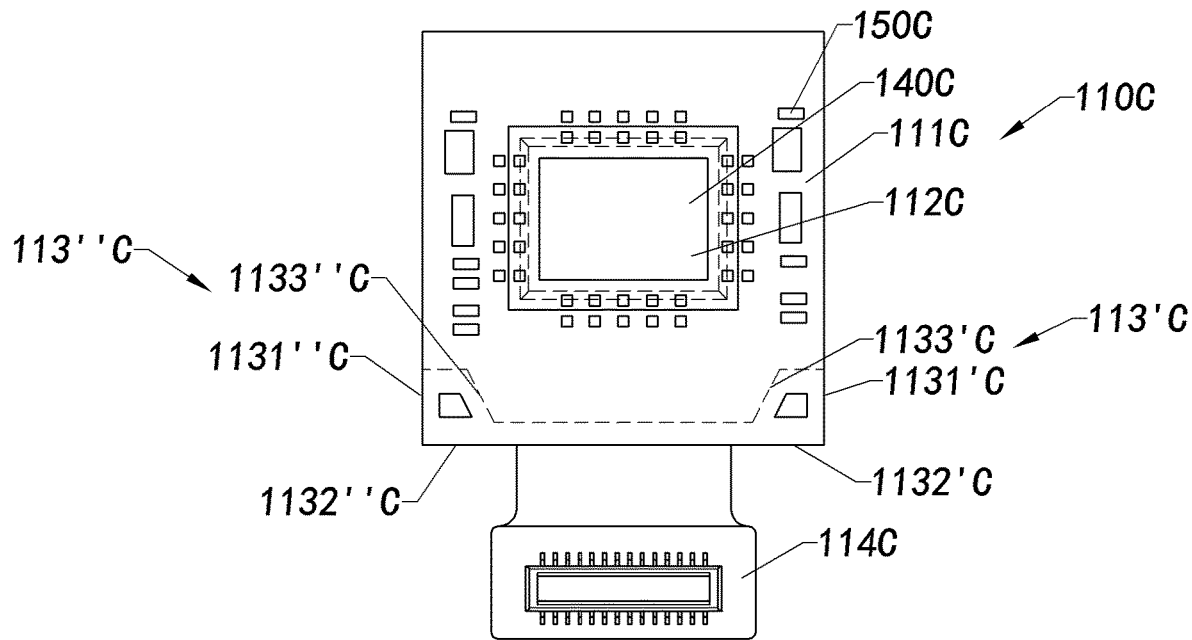
FIG. 14 is a top view of a jointed board of circuit board for molded assemblies according to the second preferred embodiment of the invention.
Figure 15:
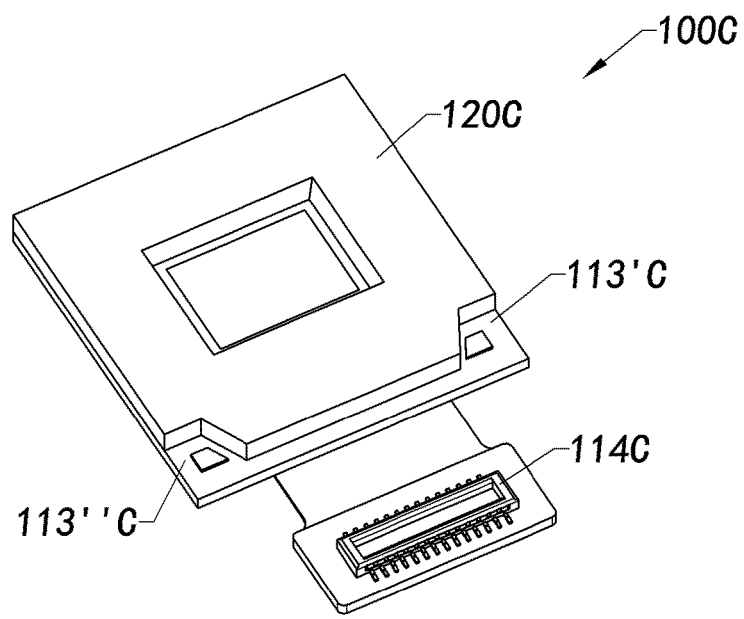
FIG. 15 is a perspective view of the molded assembly according to the second preferred embodiment of the invention.

In addition, the designs of the jointed board of molded assembly 200B may be varied. As shown in FIG. 13, taking the molding regions 111B of two adjacent rows as a group, the main pad regions 211B are arranged at the corners of the adjacent sides of the molding regions 111B of the adjacent columns in the same group, wherein the main pad regions 211B located at the length ends of the jointed board of molded assembly 200B are implemented as triangles, and each of them is divided into two parts after cutting in the width direction; and the main pad regions 211B located in the middle region are implemented as squares, and each of them is divided into four parts after cutting in the length and width directions. At this time, the main pad regions 211B of the molded assembly 100B obtained after cutting in the same group are located at the two opposite adjacent sides of the mounting side, that is, two are located at the left side of the mounting side, and the other two are located at the right side of the mounting side.

Correspondingly, in the mold 300, corresponding to the main pad regions 211B, except that the cross section of the first protrusions 311 at the two length ends of the upper mold 310 is a triangle, the cross section of the other first protrusions 311 in the middle region is a square, corresponding to the size and shape of the main pad region 211.

Figure 12:
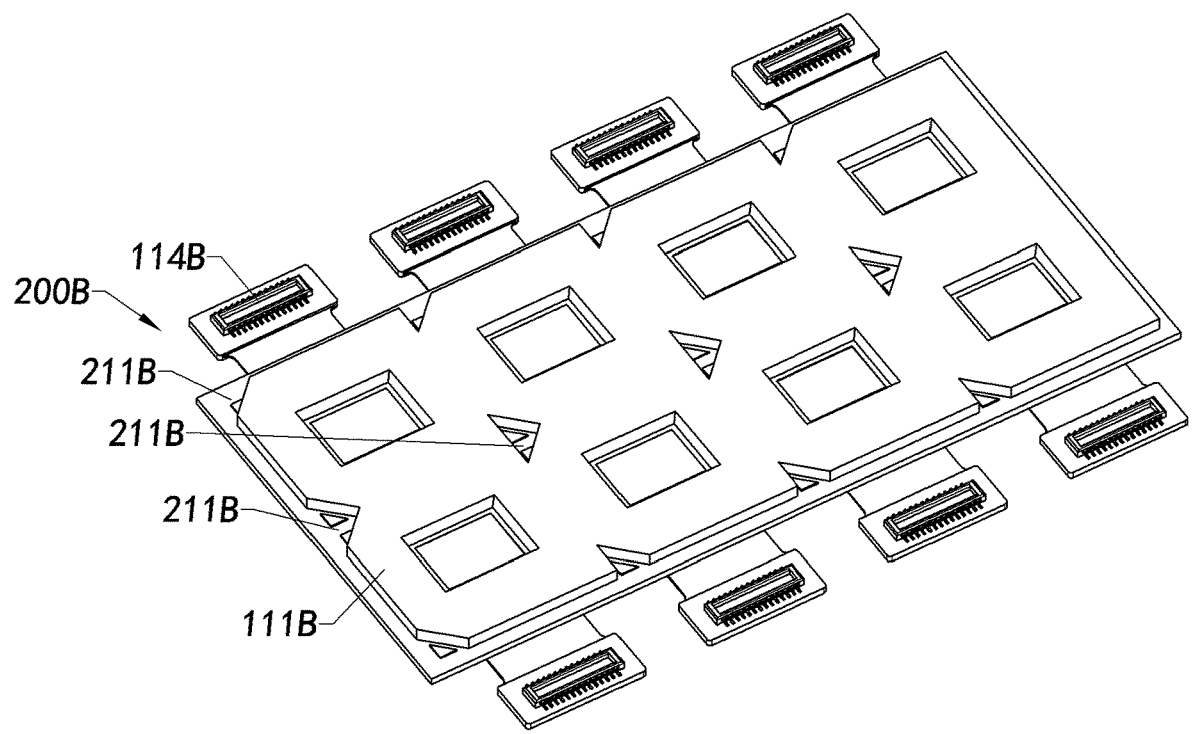
FIG. 12 is a perspective view of another jointed board of molded assembly according to a second variant embodiment of the above preferred embodiment of the invention, and the jointed board of molded assembly is suitable for the production of the molded assemblies according to the above second modified embodiment.

Alternatively, as shown in FIG. 12, the main pad regions 211B are arranged at the corners of the same column side of each column of the molding regions 111B, for example, they are arranged at the corners of the left column side of each column of the molding regions 111B, or they are arranged at the corners of the right column side of each column of the molding regions 111B, wherein the cross section of the main pad regions 211B located at the length ends of the jointed board of molded assembly 200B is implemented as a triangle, and it is divided into two parts after cutting in the width direction; and the cross section of the main pad regions 211B located in the middle region is implemented as an isosceles triangle, and it is divided into two parts after cutting in the length and width directions. At this time, the main pad regions 211B of the molded assemblies 100B obtained by cutting the molding regions 111B in the same column are located at the same adjacent sides of the mounting side, while the main pad regions 211B of the molded assemblies 100B obtained by cutting the molding regions 111B in the adjacent columns are located at the two opposite adjacent sides of the mounting side.

Correspondingly, in the mold 300, the cross section of the first protrusions 311 at two length ends of the upper mold 310 is a triangle, and the cross section of the other first protrusions 311 located in the middle region is an isosceles triangle, corresponding to the size and shape of the main pad region 211.

As shown in FIGS. 14-17, which is a second preferred embodiment of the invention, a molded assembly 100C includes a circuit board 110C, a molded portion 120C, a photosensitive element 140C, and at least one electronic component 150C. The circuit board 110C includes a connector 114C and has a molding region 111C, a first pad region 113'C, a second pad region 113"C, and a mounting region 112C. The first pad region 113'C is formed by two first outer boundaries 1131'C, 1132'C and a first avoidance boundary 1133'C which are connected end-to-end. The second pad region 113"C is formed by two first outer boundaries 1131"C, 1132"C and a second avoidance boundary 1133"C which are connected end-to-end.

Different from the above preferred embodiment, the first pad region 113'C is implemented as a trapezoid, wherein a angle formed by the first pad region 113'C at a molding side (a side in contact with the molding region 111C) is greater than 90° and less than 180°, i.e., the first avoidance boundary 1133'C forms an obtuse angle. Compared with the right-angle design in the prior art, the obtuse-angled oblique side of the first avoidance boundary 1133'C may guide the molding fluid and has less resistance to fluid movement, thereby avoiding the adverse injection caused by the continuous right-angle turning of the molding fluid, and reducing the defective rate.

Correspondingly, the second pad region 113"C is also implemented as a trapezoid, which is mirror-symmetrical to the first pad region 113'C. Similarly, the second avoidance boundary 1133"C forms an obtuse angle, that is, a angle formed at the molding side (a side in contact with the molding region 111C) is greater than 90° and less than 180°.

In the second preferred embodiment, the trapezoidal first pad region 113'C and second pad region 113"C are arranged at a mounting side of the molded assembly 100C. During the molding process, a molding flow channel between the first pad region 113'C and the second pad region 113"C is guided to flow in and out by the obtuse-angled oblique side of a first avoidance boundary 1133'C and a second avoidance boundary 1133". Compared with the right-angle design, the molding fluid is less restricted and obstructed, and it may be guided to complete the injection molding.

Figure 16:
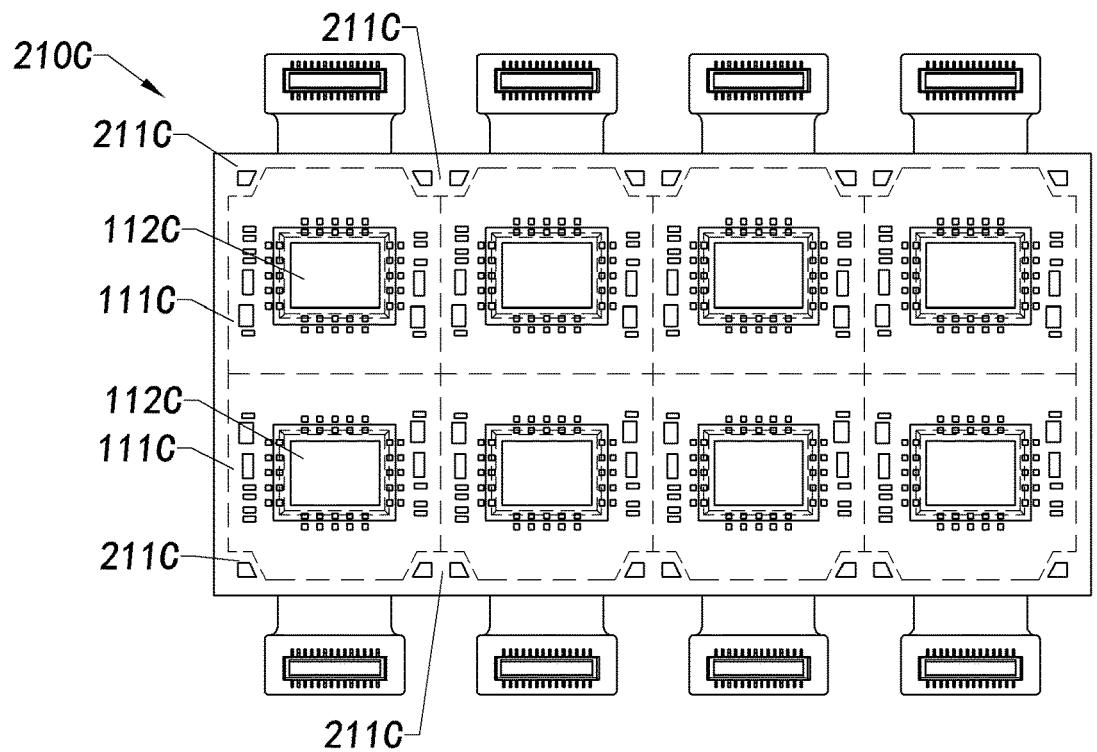
FIG. 16 is a top view of a jointed board of circuit board for a jointed board of molded assembly according to the second preferred embodiment of the invention.
Figure 17:
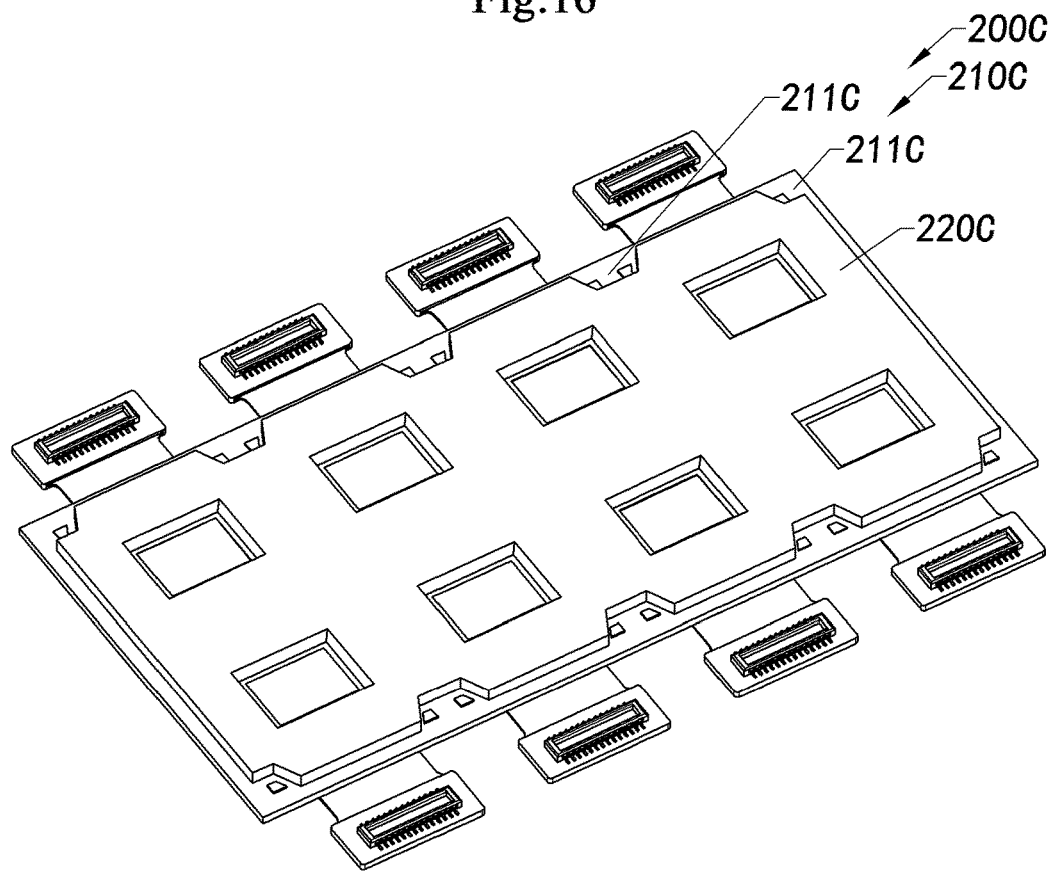
FIG. 17 is a perspective view of the above jointed board of molded assembly according to the second preferred embodiment of the invention, and the jointed board of molded assembly is suitable for the production of the above molded assemblies according to the second embodiment.

As shown in FIG. 16 and FIG. 17, it is a jointed board of molded assembly 200C for producing the molded assemblies 100C. The jointed board of molded assembly 200C includes a jointed board of circuit board 210C and a one-piece molded portion 220C. The jointed board of circuit board 210C has a plurality of molding regions 111C, a plurality of main pad regions 211C, a plurality of mounting regions 112C, and a plurality of connectors 114C.

The difference from the above preferred embodiment is that, in order to form the molded assembly 100C after cutting, the main pad region 211C is implemented as a trapezoid, wherein an angle of the main pad region 211C at the molding side is an obtuse angle. In the second preferred embodiment, the trapezoidal main pad region 211C are arranged at the corners of the mounting side of the molding region 111C, except that the main pad regions 211C located at the two width ends of the jointed board of molded assembly 200C are right-angled trapezoids by using the edge of the circuit board, and the other main pad regions 211C in the middle region are isosceles trapezoids, and each of them is cut in the width direction to divide into two right-angled trapezoids, which are respectively located at the corners of the mounting side of the corresponding molding region 111C.

Correspondingly, the difference from the above preferred embodiment is that, in order to fit and form the jointed board of molded assembly 200C, the position, shape and size of the second protrusion 312 are matched to those of the pad region 211C of the molded assembly 200C. That is, in the second preferred embodiment, the cross section of the second protrusion 312 is implemented as a trapezoid. Particularly, corresponding to the main pad regions 211C located at the two width ends of the jointed board of molded assembly 200C, the cross section of the second protrusion 312 is implemented as a right-angled trapezoid; corresponding to the other main pad regions 211C located in the middle region, the cross section of the second protrusion 312 is implemented as an isosceles trapezoid.

Figure 18:
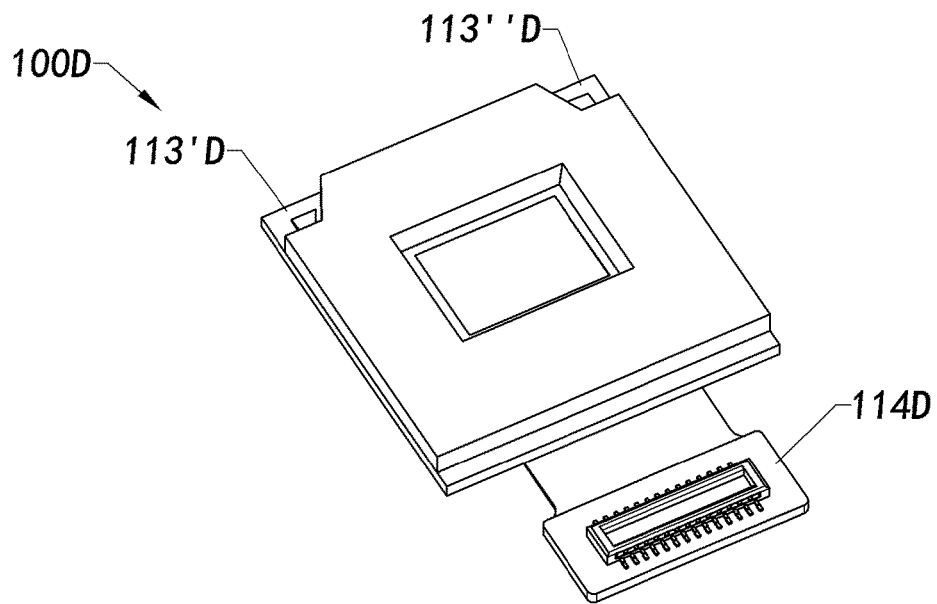
FIG. 18 is a perspective view of a molded assembly according to a variant embodiment of the second preferred embodiment of the invention.
Figure 19:
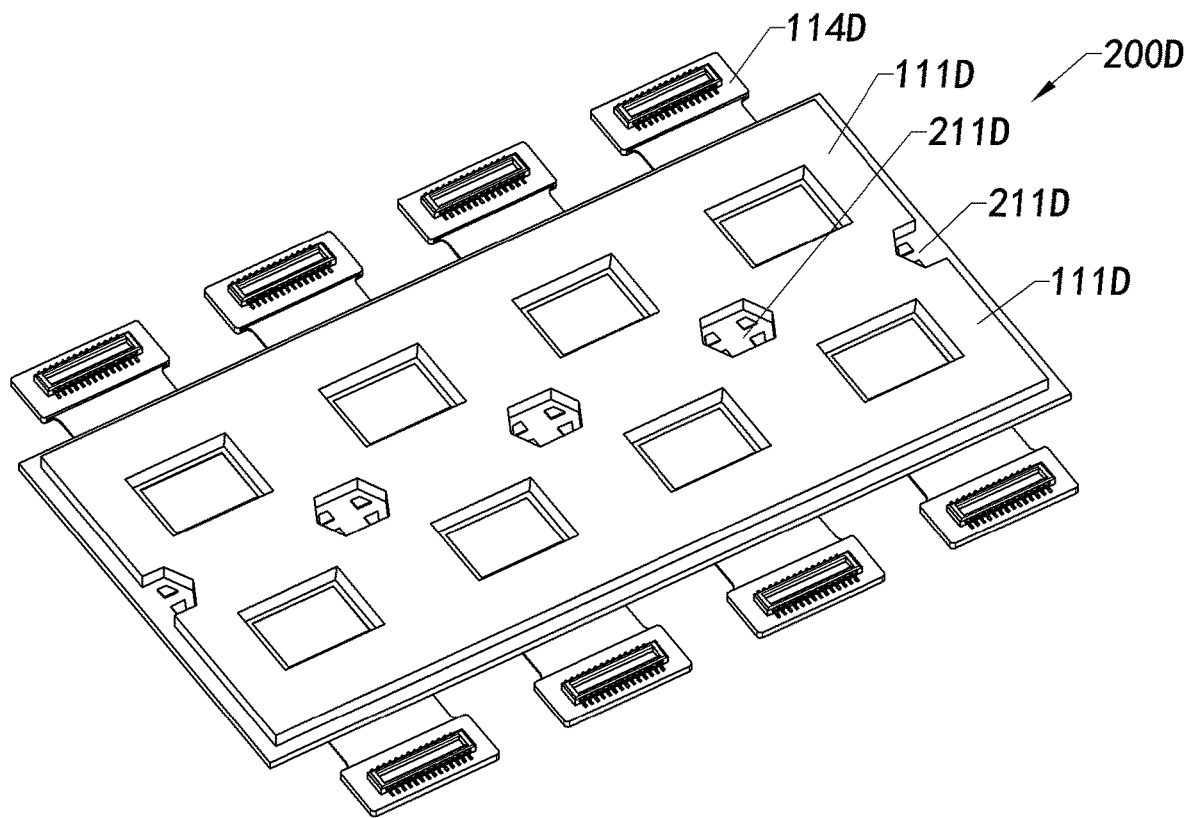
FIG. 19 is a perspective view of a jointed board of molded assembly according to a variant embodiment of the above second preferred embodiment of the invention, and the jointed board of molded assembly is suitable for the production of the molded assemblies of the modified embodiment.
Figure 20:
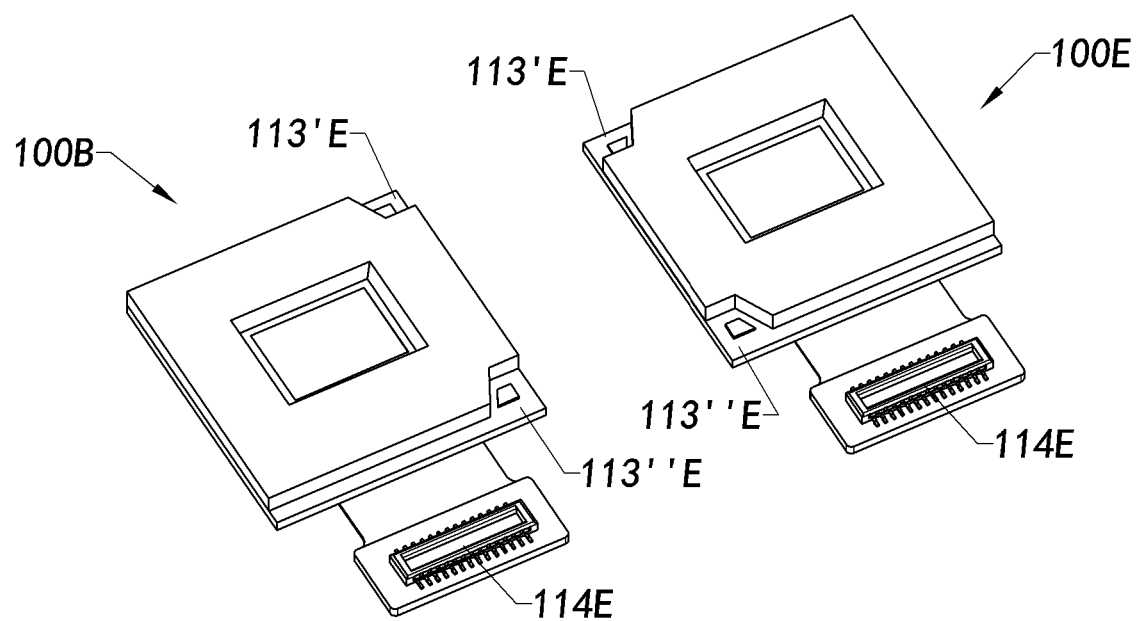
FIG. 20 is a perspective view of a molded assembly according to another variant embodiment of the above second preferred embodiment of the invention.

As shown in FIGS. 18 to 19, it is a variant embodiment of the above second preferred embodiment. The difference from the above second preferred embodiment is that, a trapezoidal first pad region 113'D and second pad region 113"D are arranged at a side opposite to a mounting side of a molded assembly 100D, instead of a mounting side where a connectors 114D are mounted.

Correspondingly, as shown in FIG. 19, in order to form the molded assembly 100D after cutting, in a jointed board of molded assembly 200D, a main pad region 211D is arranged at corners of a connecting side of adjacent molding regions 111D in a same column, so that the first pad region 113'D and the second pad region 113"D formed by cutting and separating the main pad region 211D are arranged at a side opposite to the mounting side of the molded assembly 100D.

Further, in this variant embodiment of the second preferred embodiment, except that the main pad regions 211D located at two width ends of the jointed board of molded assembly 200D are implemented as a jointed shape of two right-angle trapezoids which are jointed together in the length direction by using it as mirror-symmetrical axis, and two right-angle trapezoids are formed by cutting and separating in the length direction; the other main pad regions 211D located in the middle regions are implemented as hexagons, and four right-angled trapezoids are formed by cutting and separating in the length and width directions, and they are located at the corners of the corresponding molded assembly 100D.

Correspondingly, in the mold 300, except that the cross section of the first protrusions 311 located at the two width ends of the upper mold 310 is implemented as a jointed shape of two right-angle trapezoids which are jointed together in the length direction by using it as mirror-symmetrical axis, and the cross section of the other first protrusions 311 located in the middle region is a hexagon, corresponding to the size and shape of the main pad region 211D.

As shown in FIGS. 20-23, it is another variant embodiment of the second preferred embodiment described above. The difference from the second preferred embodiment described above is that, in a molded assembly 100E, a trapezoidal first pad region 113'E and second pad region 113"E are arranged a side adjacent to a mounting side, instead of a mounting side where a connectors 114E are mounted.

Figure 21:
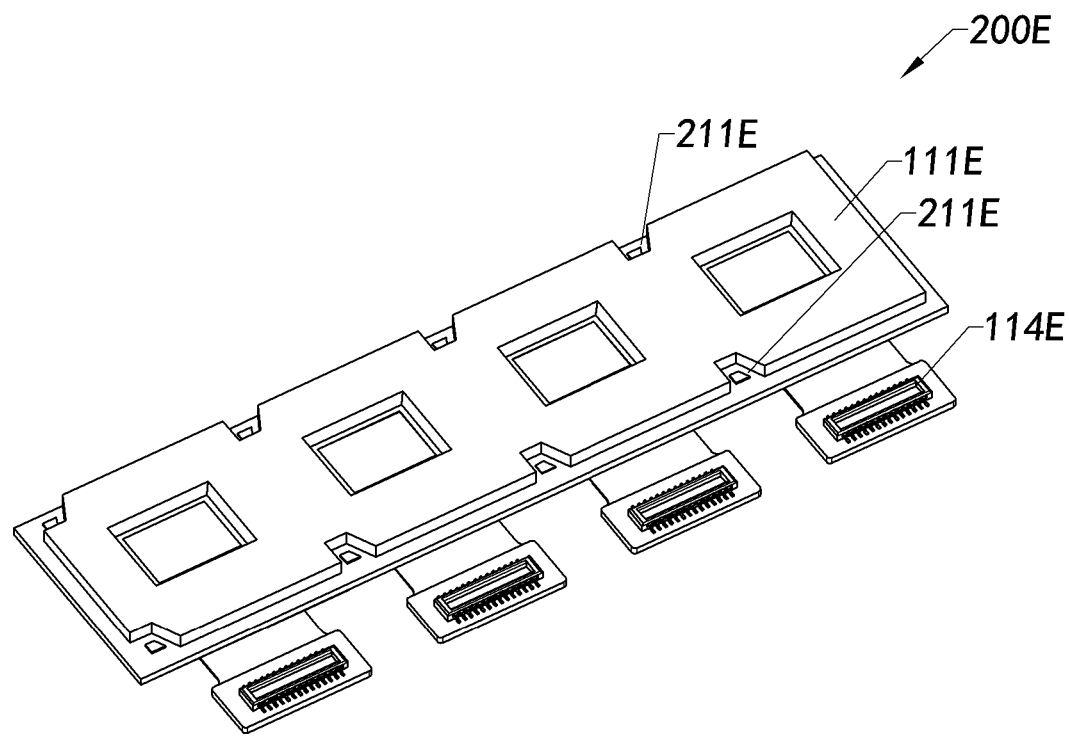
FIG. 21 is a perspective view of a jointed board of molded assembly according to another variant embodiment of the above second preferred embodiment of the invention, and the jointed board of molded assembly is suitable for the production of the molded assemblies according to the above another modified embodiment.

Correspondingly, as shown in FIG. 21, in order to form a molded assembly 100E after cutting, in a jointed board of molded assembly 200E, a main pad region 211E are arranged at corners of a side adjacent to a mounting side of a molding regions 111E in a same row, so that the first pad region 113'E and the second pad region 113"E formed by cutting and separating the main pad region 211E are arranged at a side adjacent to the mounting side of the molded assembly 100E. At this time, position arrangements of the pad regions obtained by cutting the molding regions 111B in the same row are consistent. For example, the pad regions are all located at the left side adjacent to the mounting side of the molding regions 111B, or all located at the right side adjacent to the mounting side of the molding regions 111B.

In addition, the design of the jointed board of molded assembly 200E may be varied. As shown in FIG. 23, taking the molding regions 111E of two adjacent rows as a group, the main pad regions 211E are arranged at the corners of the adjacent sides of the molding regions 111E of the adjacent columns in the same group, wherein the main pad regions 211E located at the length ends of the jointed board of molded assembly 200E are implemented as a jointed shape of two right-angle trapezoids which are jointed together in the width direction by using it as mirror-symmetrical axis, and each of them is divided into two parts after cutting in the width direction; and the main pad regions 211E located in the middle region are implemented as hexagons, and each of them is divided into four trapezoids after cutting in the length and width directions. At this time, the main pad regions 211E of the molded assembly 100E obtained after cutting in the same group are located at two different sides adjacent to the mounting side, that is, two are located at the left side of the mounting side, and the other two are located at the right side of the mounting side.

Correspondingly, in the mold 300, except that the cross section of the first protrusions 311 at the two length ends of the upper mold 310 is a jointed shape of two right-angle trapezoids which are jointed together in the width direction by using it as mirror-symmetrical axis, the cross section of the first protrusions 311 located in the middle region is a hexagon, corresponding to the size and shape of the main pad region 211E.

Figure 22:
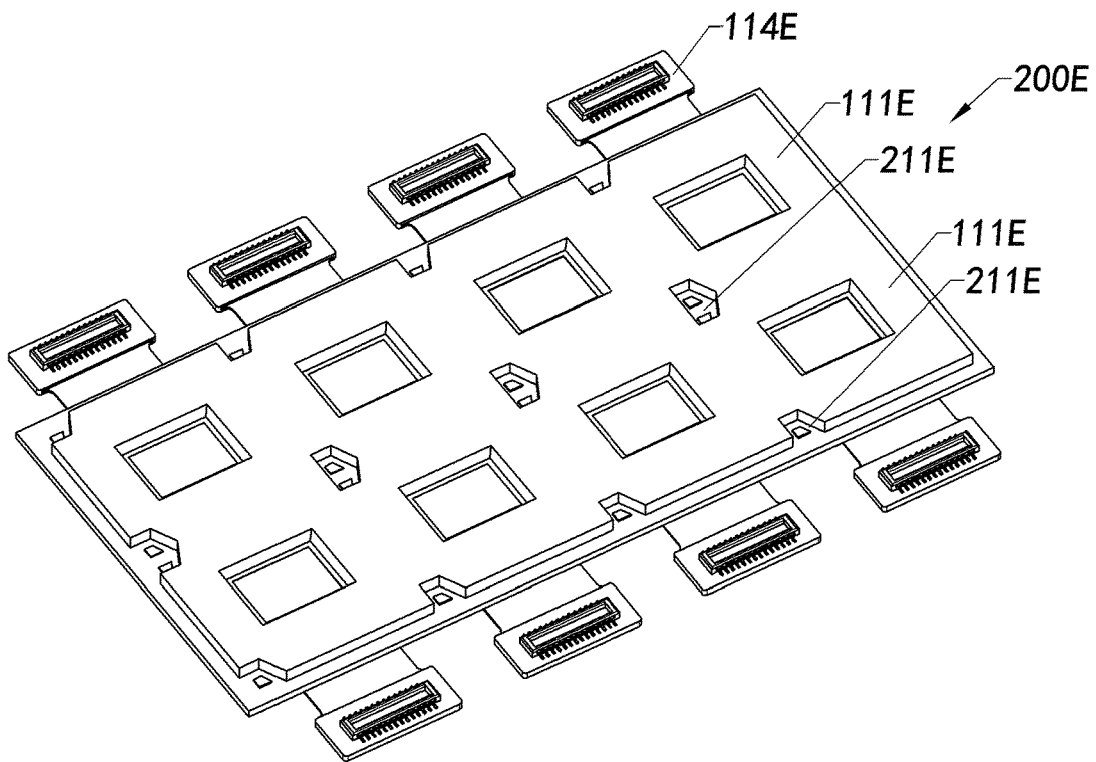
FIG. 22 is a perspective view of another jointed board of molded assembly according to another variant embodiment of the above second preferred embodiment of the invention, and the jointed board of molded assembly is suitable for the production of the molded assemblies according to the above another modified embodiment.

Alternatively, as shown in FIG. 22, the main pad region 211E are arranged at the corners of the same column side of each column of the molding regions 111E, for example, they are arranged at the corners of the left column side of each column of the molding regions 111E, or they are arranged at the corners of the right column side of each column of the molding regions 111E, wherein the cross section of the main pad regions 211E located at the length ends of the jointed board of molded assembly 200E is implemented as a trapezoid, and it is divided into two parts after cutting in the width direction; and the cross section of the main pad regions 211E located in the middle region is implemented as a jointed shape of two right-angle trapezoids which are jointed together in the width direction by using it as mirror-symmetrical axis, and it is divided into two parts after cutting in the length and width directions. At this time, the main pad regions 211E of the molded assemblies 100E obtained by cutting the molding regions 111E in the same column are located at the same adjacent sides of the mounting side, while the main pad regions 211E of the molded assemblies 100E obtained by cutting the molding regions 111E in the adjacent columns are located at the two opposite adjacent sides of the mounting side.

Correspondingly, in the mold 300, the cross section of the first protrusions 311 at two length ends of the upper mold 310 is a trapezoid, and the cross section of the other first protrusions 311 located in the middle region is a jointed shape of two right-angle trapezoids which are jointed together in the width direction by using it as mirror-symmetrical axis, corresponding to the size and shape of the main pad region 211E.

That is to say, the formation and position of the pad region are not mutually restricted, and they may be combined with each other to form different embodiments, which will not be repeated herein. The first pad region and the second pad region may also be located at opposite corners of the circuit board, so as to adapt to the corresponding actuators. In addition, the first pad region and the second pad region may also be other polygons, such as a hexagon, an octagon, etc., as long as the angle formed by the avoidance boundary is greater than 90°, as compared to the existing design of 90°, the design of the invention has less resistance to the molding fluid, and the oblique edge may guide the molding fluid and form a buffer flow channel, so that the molding fluid may be fully filled.

Figure 25:
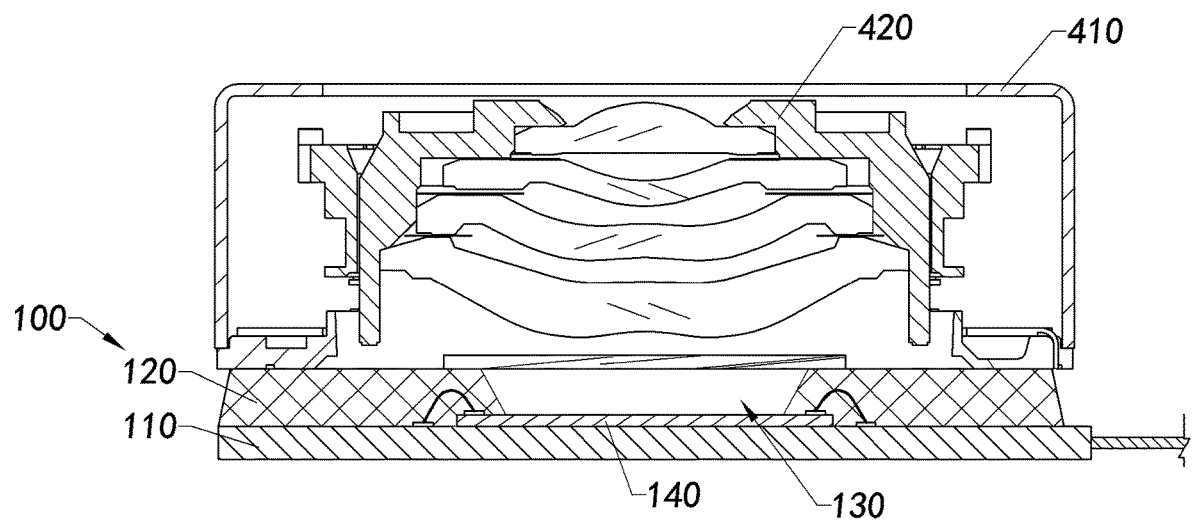
FIG. 25 is a cross sectional view of the auto focus camera module according to the above embodiment of the invention.
Figure 26:
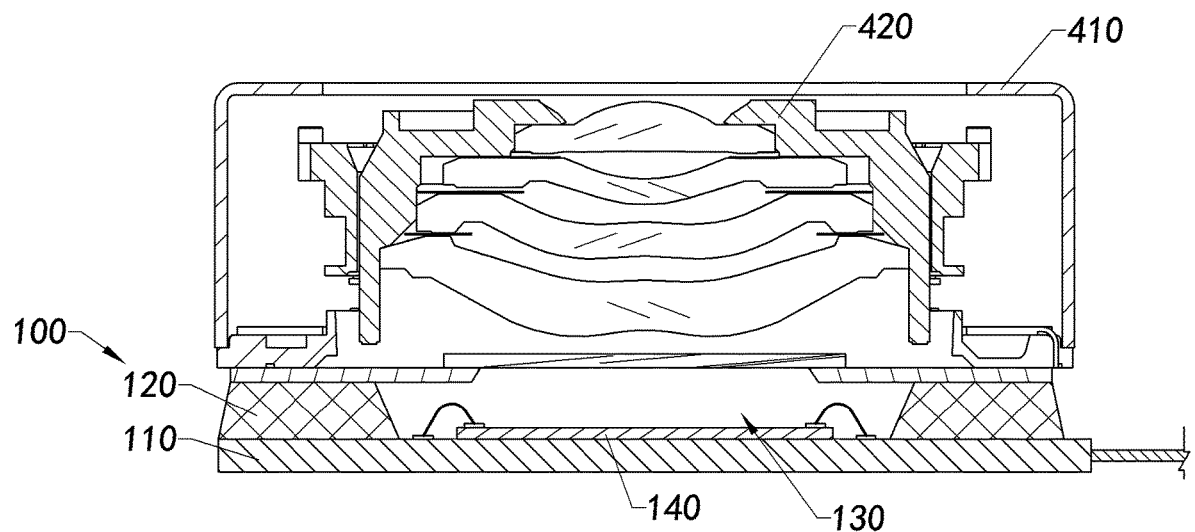
FIG. 26 is a cross sectional view of an auto focus camera module according to above another embodiment of the invention.

As shown in FIGS. 24-26, it is a camera module 400 to which the molded assemblies of the above embodiments of the invention are applied. The camera module 400 includes the molded assembly 100, an actuator 410, and a lens assembly 420, wherein the actuator 410 supports the lens assembly 420 on the molded assembly 100 in a drivable manner, so that the lens assembly 420 corresponds to the light window 130 of the molded assembly 100. The actuator 410 is operatively connected to the first pad region 113' and the second pad region 113" of the circuit board 110. The first pad region 113' and the second pad region 113" may adopt the features such as formation, shape, and position mentioned in the above embodiments, which are not limited herein. Further, the camera module 400 may further include a color filter, which is supported on the top side of the molded assembly 100 through a bracket or directly, and corresponds to the light window 130.

In the invention, due to the redesign of the first pad region 113' and the second pad region 113", the defective rate of the molded assembly 100 is reduced, thereby increasing the yield of the camera module 400.

According to another aspect of the invention, the invention further provides a method for manufacturing a jointed board of molded assembly, which includes the following steps:

Step 501: fixing a jointed board of circuit board to a lower mold, wherein the jointed board of circuit board has a plurality of molding regions, a plurality of mounting regions and a plurality of main pad regions, wherein the molding regions are arranged in an array on the jointed board of circuit board, the adjacent molding regions are neighboring, the main pad regions are cut and separated to form pad regions at the corners of the molding regions, and wherein the pad region formed after cutting has an avoidance boundary, and an angle formed by the avoidance boundary is greater than 90°;

Step 502: clamping an upper mold with the lower mold, wherein the upper mold is pressed against the main pad regions and the mounting regions, and a molding space is formed between the upper mold and the molding regions of the jointed board of circuit board, wherein the molding space has a buffer flow channel formed along the avoidance boundary;

Step 503: injecting molding material into the molding space;

Step 504: curing the molding material to form a one-piece molded portion embedding the molding regions;

Step 505: mounting a photosensitive chip and/or at least one electronic component in the mounting region, wherein the one-piece molded portion surrounds the outside of the photosensitive chip and/or at least one electronic component; and Step 506: removing the upper mold and the lower mold to form the jointed board of molded assembly.

The step 505 may be implemented after the step 504, or before the step 501. At this time, the edge region of the photosensitive chip is located in the molding region, so that the one-piece molded portion of the step 504 may be embedded in the edge region of the photosensitive chip. That is to say, according to requirements of different process, the order and position for mounting the photosensitive chip and/or at least one electronic component in step 505 are correspondingly different. It may be known that, the arrangements and characteristics of the main pad regions in the jointed board of molded assembly are suitable for the formation and characteristics of the main pad region described above, and the corresponding molded assembly is formed by cutting the jointed board of molded assembly.

Those skilled in the art should understand that, the above description and the embodiments of the invention shown in the drawings are only examples and not intend to limit the invention. The purpose of the invention has been completely and effectively achieved. The functions and structural principles of the invention have been shown and explained in the embodiments. Any variation or modification may be made to the embodiments of the invention without departing from the principles of the invention.

The invention claimed is:

1. A molded assembly comprising:
a circuit board, wherein the circuit board has a molding region, a mounting region, and at least two pad regions each having a triangle shape, the molding region surrounds the mounting region, the two pad regions are arranged at corners of the circuit board and located outside corresponding corners of the molding region so as to electrically connect to an actuator, each of the two pad regions has an avoidance boundary as a hypotenuse of the triangle shape, and an angle formed by the avoidance boundaries of the two pad regions is greater than 90°; and
a molded portion, wherein the molded portion embeds the molding region, surrounds the mounting region, and has a light window, and the molded portion avoids the two pad regions along the avoidance boundaries.

2. The molded assembly according to claim 1, wherein the angle formed by the avoidance boundaries of the two pad regions is 180°.

3. The molded assembly according to claim 1, wherein the angle formed by the avoidance boundaries of the two pad regions is an obtuse angle.

4. The molded assembly according to claim 1, wherein a size of a narrowest part of the molded portion is at least 0.15 mm.

5. The molded assembly according to claim 1, wherein two pad regions of the at least two pad regions are adjacent and are symmetrically arranged.

6. The molded assembly according to claim 5, wherein
at least two pad regions of the at least two pad regions are arranged on a mounting side of the circuit board, or a side opposite to the mounting side of the circuit board, or a side adjacent to the mounting side of the circuit board, and
the mounting side is provided for mounting a connector.

7. The molded assembly according to claim 1, further comprising a photosensitive element, wherein
the photosensitive element is mounted in the mounting region and is surrounded by the molded portion in a closed manner, and
the light window corresponds to the photosensitive element so as to form a photosensitive path.

8. The molded assembly according to claim 7, wherein the molded portion is molded in an edge portion of the photosensitive element.

9. The molded assembly according to claim 1, further comprising at least one electronic component, wherein
the electronic component is operatively mounted in the molding region, and
the molded portion embeds the electronic component.

10. A camera module comprising:
a molded assembly according to claim 1;
a lens assembly; and
the actuator, wherein
the actuator supports the lens assembly on the molded assembly in a drivable manner so that the lens assembly corresponds to the light window of the molded assembly, and the actuator is operatively connected to the two pad regions of the circuit board.

11. A jointed board of molded assembly for forming a plurality of molding assemblies with pad regions by cutting, the jointed board comprising:
a jointed board of circuit board, wherein the jointed board of circuit board has a plurality of molding regions, a plurality of mounting regions, and a plurality of main pad regions, the molding regions are arranged in an array on the jointed board of circuit board, adjacent molding regions of the molding regions are neighboring, the molding regions surround the mounting regions correspondingly, the main pad regions are cut and separated to form pad regions each having a triangle shape at corners of each of the molded assemblies, and each of the pad regions of each of the molded assemblies formed after cutting has an avoidance boundary as a hypotenuse of the triangle shape, and an angle formed by the avoidance boundaries of the pad regions of each of the molded assemblies is greater than 90°; and
a one-piece molded portion, wherein the one-piece molded portion embeds the molding regions, surrounds the mounting regions, and defines a plurality of light windows.

12. The jointed board of molded assembly according to claim 11, wherein the main pad regions are arranged at intervals on a length side of the jointed board of circuit board, so that the pad regions formed after cutting are located at corners of a mounting side of the resulting molded assemblies.

13. The jointed board of molded assembly according to claim 11, wherein the main pad regions are arranged at corners of a connecting side of the adjacent molding regions in a same column, so that the pad regions formed after cutting are located at corners of a side opposite to a mounting side of the resulting molded assemblies.

14. The jointed board of molded assembly according to claim 11, wherein the main pad regions are arranged at corners of a side adjacent to the molding regions of two adjacent columns in a same group, so that the pad regions formed after cutting are located at corners of a side adjacent to a mounting side of the resulting molded assemblies.

15. The jointed board of molded assembly according to claim 11, wherein the main pad regions are arranged at corners of a side of a same column of the molding regions in each column, so that the pad regions formed after cutting are located at corners of a side adjacent to a mounting side of the resulting molded assemblies.

16. The jointed board of molded assembly according to claim 11, wherein the main pad regions are arranged at corners of a side adjacent to a mounting side of the molding regions in a same row, so that the pad regions formed after cutting and separating the main pad regions are located at a side adjacent to the mounting side of the molded assemblies.

17. The jointed board of molded assembly according to claim 11, wherein an angle formed by the avoidance boundaries of the pad regions of each of the molded assemblies formed after cutting is 180°.

18. The jointed board of molded assembly according to claim 11, wherein an angle formed by the avoidance boundaries of the pad regions of each of the molded assemblies formed after cutting is an obtuse angle.

19. The jointed board of molded assembly according to claim 11, further comprising a plurality of photosensitive elements, wherein the photosensitive elements are mounted in the corresponding mounting regions and are surrounded by the one-piece molded portion in a closed manner, and each of the light windows corresponds to one of the photosensitive elements so as to form respective photosensitive paths.

20. The jointed board of molded assembly according to claim 19, wherein the one-piece molded portion is molded at edge portions of the photosensitive elements.

* * * * *